US012111262B2

(12) United States Patent
Emadi et al.

(10) Patent No.: US 12,111,262 B2
(45) Date of Patent: Oct. 8, 2024

(54) WAVEGUIDE INTEGRATION WITH OPTICAL COUPLING STRUCTURES ON LIGHT DETECTION DEVICE

(71) Applicant: ILLUMINA, INC., San Diego, CA (US)

(72) Inventors: Arvin Emadi, San Diego, CA (US); Arnaud Rival, San Diego, CA (US); Fabien Abeille, Grenoble (FR); Ali Agah, San Diego, CA (US); Craig Ciesla, San Diego, CA (US); Aathavan Karunakaran, San Diego, CA (US)

(73) Assignee: Illumina Inc., San Diego, CA (US)

( * ) Notice: Subject to any disclaimer, the term of this patent is extended or adjusted under 35 U.S.C. 154(b) by 299 days.

(21) Appl. No.: 17/419,375

(22) PCT Filed: Jun. 25, 2020

(86) PCT No.: PCT/US2020/039552
§ 371 (c)(1),
(2) Date: Jun. 29, 2021

(87) PCT Pub. No.: WO2021/007039
PCT Pub. Date: Jan. 14, 2021

(65) Prior Publication Data
US 2022/0120684 A1    Apr. 21, 2022

Related U.S. Application Data

(60) Provisional application No. 62/871,596, filed on Jul. 8, 2019.

(51) Int. Cl.
*G01N 21/64* (2006.01)
*G01N 15/1434* (2024.01)
(Continued)

(52) U.S. Cl.
CPC .......... *G01N 21/645* (2013.01); *G02B 6/124* (2013.01); *H01L 27/14825* (2013.01);
(Continued)

(58) Field of Classification Search
CPC .. G01N 21/645; G01N 21/05; G01N 21/0303; G01N 2021/058;
(Continued)

(56) References Cited

U.S. PATENT DOCUMENTS 5,832,165 A * 11/1998 Reichert ................ G01N 21/05
385/12
6,723,516 B1 * 4/2004 Tom-Moy ........ G01N 33/54373
435/7.1
(Continued)

FOREIGN PATENT DOCUMENTS

CN    1971267 A    5/2007
CN    1993640 A    7/2007
(Continued)

OTHER PUBLICATIONS

Wiederkehr et al (2009). Investigations on the Q and CT Bands of Cytochrome c Submonolayer Adsorbed on an Alumina Surface Using Broadband Spectroscopy with Single-Mode Integrated Optical Waveguides. The Journal of Physical Chemistry C. 113. 8306-8312. 10.1109/OMEMS.2009.5338580. (Year: 2009).*
(Continued)

*Primary Examiner* — Uzma Alam
*Assistant Examiner* — Jonathon Cook
(74) *Attorney, Agent, or Firm* — Heslin Rothenberg Farley and Mesiti, P.C.

(57) ABSTRACT

Provided herein include various examples of an apparatus, flow cells that include these examples of the apparatus, and methods of making these examples of the apparatus. The apparatus can include a molding layer over a substrate and
(Continued)

covering sides of a light detection device. The molding layer comprises a first region and a second region, which, with the active surface of the light detection device, form a contiguous surface. A waveguide integration layer is between the contiguous surface and a waveguide. The waveguide integration layer comprises optical coupling structures over the first and second regions, to optically couple light waves from a light source to the waveguide. The waveguide utilizes the light waves to excite light sensitive materials in nanowells. A nanostructure layer over the waveguide comprises the nanowells. Each nanowell shares a vertical axis with a location on the active surface of the light detection device.

15 Claims, 16 Drawing Sheets

(51) Int. Cl.
*G01N 21/05* (2006.01)
*G02B 6/12* (2006.01)
*G02B 6/124* (2006.01)
*H01L 27/148* (2006.01)

(52) U.S. Cl.
CPC ... *G01N 15/1436* (2013.01); *G01N 2021/058* (2013.01); *G01N 2021/6482* (2013.01); *G01N 2021/6484* (2013.01); *G02B 2006/12107* (2013.01); *G02B 2006/12138* (2013.01)

(58) Field of Classification Search
CPC ... G01N 2021/6482; G01N 2021/6484; G01N 15/1436; G01N 15/1434; G01N 15/1404; G02B 6/124; G02B 2006/12107; G02B 2006/12138
See application file for complete search history.

(56) References Cited

U.S. PATENT DOCUMENTS

| | | | |
|---|---|---|---|
| 2011/0306039 A1* | 12/2011 | Chiou | G01N 21/648 |
| | | | 385/12 |
| 2015/0376694 A1* | 12/2015 | McCaffrey | G01N 21/6428 |
| | | | 506/38 |
| 2016/0341656 A1 | 11/2016 | Liu et al. | |
| 2018/0172588 A1* | 6/2018 | Peumans | G01N 21/6428 |
| 2019/0117157 A1 | 4/2019 | Hu | |
| 2021/0162414 A1* | 6/2021 | Liu | B01L 3/502761 |

FOREIGN PATENT DOCUMENTS

| | | |
|---|---|---|
| CN | 101080500 A | 11/2007 |
| CN | 101669025 A | 3/2010 |
| CN | 101960293 A | 1/2011 |
| CN | 102686997 A | 9/2012 |
| CN | 102985803 A | 3/2013 |
| CN | 104624258 A | 5/2015 |
| CN | 104624258 B | 11/2016 |
| CN | 108107506 A | 6/2018 |
| CN | 109863396 A | 6/2019 |
| JP | 2008003061 A | 1/2008 |
| WO | 2014031157 A1 | 2/2014 |
| WO | 2018013243 A1 | 1/2018 |
| WO | 2018200300 A1 | 11/2018 |

OTHER PUBLICATIONS

International Search Report and Written Opinion of the International Searching Authority for International Application No. PCT/US2020/039552 mailed on Sep. 25, 2020.

* cited by examiner

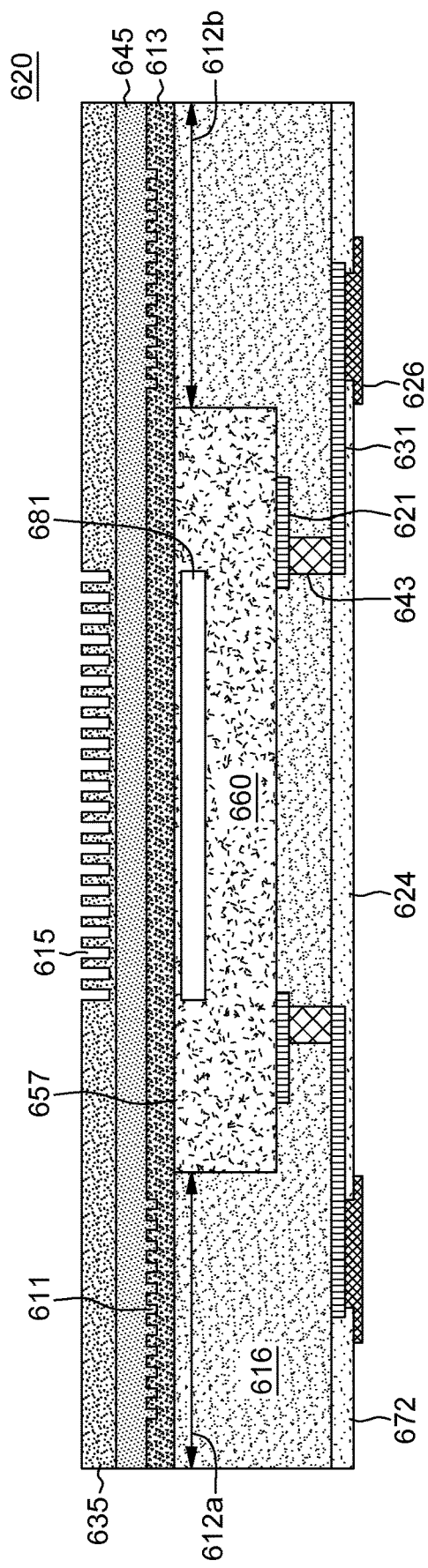
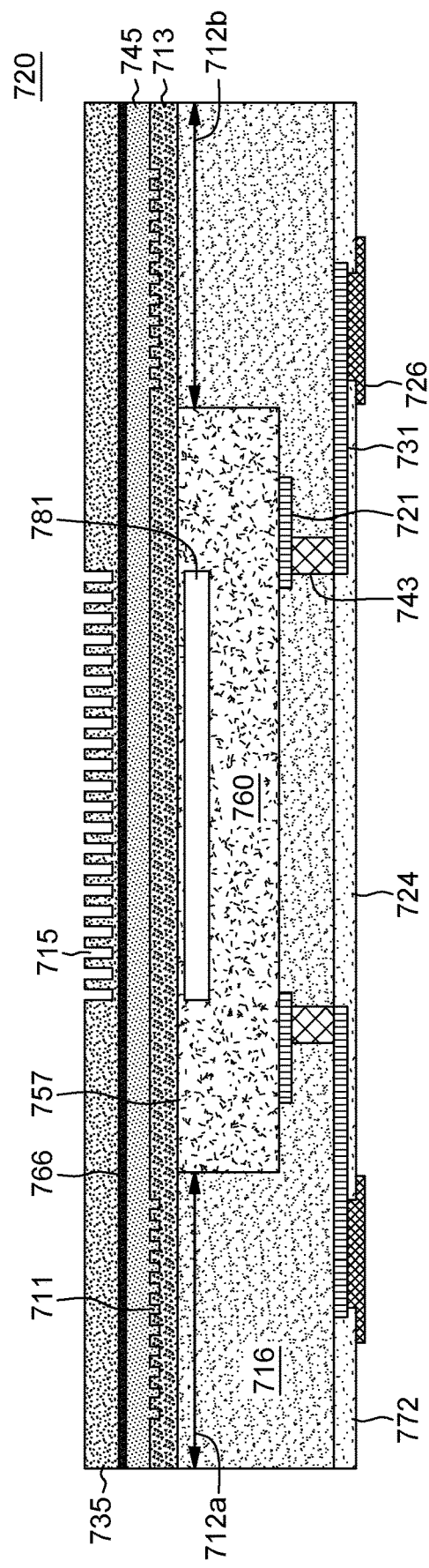
FIG. 6
FIG. 7

WAVEGUIDE INTEGRATION WITH OPTICAL COUPLING STRUCTURES ON LIGHT DETECTION DEVICE

CROSS REFERENCE TO RELATED APPLICATIONS

This Patent Application is a national stage filing under 35 U.S.C. § 371 of International Application No. PCT/US2020/039552, filed Jun. 25, 2020, and claims priority to U.S. Provisional Patent Application No. 62/871,596, filed Jul. 8, 2019, and entitled Waveguide Integration with Optical Coupling Structures on Light Detection Device. The entire contents of the aforementioned applications are hereby incorporated herein by reference.

BACKGROUND

Various protocols in biological or chemical research involve performing controlled reactions. The designated reactions can then be observed or detected and subsequent analysis can help identify or reveal properties of chemicals involved in the reaction. In some multiplex assays, an unknown analyte having an identifiable label (e.g., fluorescent label) can be exposed to thousands of known probes under controlled conditions. Each known probe can be deposited into a corresponding well of a microplate. Observing any chemical reactions that occur between the known probes and the unknown analyte within the wells can help identify or reveal properties of the analyte. Other examples of such protocols include known DNA sequencing processes, such as sequencing-by-synthesis (SBS) or cyclic-array sequencing.

In some fluorescent-detection protocols, an optical system is used to direct excitation light onto fluorophores, e.g., fluorescently-labeled analytes and to also detect the fluorescent emissions signal light that can emit from the analytes having attached fluorophores. However, such optical systems can be relatively expensive and involve a relatively large benchtop footprint. For example, the optical system can include an arrangement of lenses, filters, and light sources. In other proposed detection systems, the controlled reactions in a flow cell are defined by a solid-state light sensor array (e.g., a complementary metal oxide semiconductor (CMOS) detector). These systems do not involve a large optical assembly to detect the fluorescent emissions. However, in some existing flow cells, which include a CMOS, to enable the functionality, the top layer is optically non-transparent or does not include light diffusive or light scattering features, because in these example flow cells these features can block or perturb the excitation or emission light paths.

SUMMARY

Accordingly, it may be beneficial for the flow cell to be a small and inexpensive device. In a relatively small flow cell, it may be beneficial to utilize as much of the sensor active area of the light detection device as possible and/or provide as large as a sensor active area as possible. Shortcomings of the prior art can be overcome and benefits as described later in this disclosure can be achieved through the provision of an apparatus for utilization within a flow cell, the apparatus comprising: a molding layer over a substrate and covering sides of a light detection device, wherein the molding layer comprises a first region adjacent to a first edge of an active surface of the light detection device and a second region adjacent to a second edge of the active surface of the light detection device, wherein the first region, the second region, and the active surface of the light detection device form a contiguous surface; a waveguide integration layer between the contiguous surface and a waveguide, wherein the waveguide integration layer comprises optical coupling structures on portions of a top surface of the waveguide integration layer over the top surface of the first region, and over the top surface of the second region, wherein the optical coupling structures couple light waves from a light source to the waveguide; the waveguide over the waveguide integration layer, wherein the waveguide utilizes the light waves from the waveguide integration layer to excite light sensitive materials in one or more nanowells; and a nanostructure layer over the waveguide, the nanostructure layer comprising the one or more nanowells, wherein the one or more nanowells are formed on one or more locations on the nanostructure layer, wherein each location of the one or more locations shares a vertical axis with a location on the active surface of the light detection device.

In some examples, the first region and the second region do not overlap the active surface of the light detection device.

In some examples, the optical coupling structures comprise gratings.

In some examples, the waveguide integration layer is comprised of a material with a low index of refraction.

In some examples, the waveguide comprises a material with a high index of refraction.

In some examples, the nanostructure layer comprises a material with a low index of refraction.

In some examples, the apparatus further comprises: one or more low index layers between the waveguide and the nanostructure layer.

In some examples, the apparatus further comprises: a filter layer over the contiguous surface and under the waveguide integration layer, wherein the filter layer blocks light from the waveguide from leaking to the light detection device.

In some examples, the light source is selected from the group consisting of: a light emitting diode and a laser diode.

In some examples, the light detection device comprises one or more photodiodes, wherein each of the one or more photodiodes is located beneath one or more nanowells.

In some examples, the light detection device comprises a Complementary Metal-Oxide-Semiconductor (CMOS) detection device.

In some examples, the apparatus further comprises: a top layer over the contiguous surface, wherein the top layer and the active surface collectively form a space over the nanostructure layer, the space defining a flow channel.

In some examples, the top layer further comprises a feature selected from the group consisting of an electrical component and a physical structure.

In some examples, the top layer comprises an electrode.

In some examples, the top layer comprises a herringbone trench.

In some examples, the waveguide comprises one or more slab waveguides.

In some examples, the top layer comprises: a second molding layer below a second substrate and covering sides of a second light detection device, wherein the second molding layer comprises a first region adjacent to a first edge of an active surface of the second light detection device and a second region adjacent to a second edge of the active surface of the second light detection device, wherein the first region of the second molding layer, the second region of the second molding layer, and the active surface of the second light detection device form a second contiguous surface; a second waveguide integration layer between the second contiguous surface and a second waveguide, wherein the second waveguide integration layer comprises optical coupling structures on portions of a top surface of the second waveguide integration layer below the top surface of the first region of the second molding layer, and below the top surface of the second region of the second molding layer, wherein the optical coupling structures on the portions of the top surface of the second waveguide integration layer couple light waves from the light source to the second waveguide; the second waveguide below the waveguide integration layer, wherein the second waveguide utilizes the light waves from the second waveguide integration layer to excite light sensitive materials in one or more additional nanowells; and a second nanostructure layer below the second waveguide, the second nanostructure layer comprising the one or more additional nanowells, wherein the one or more additional nanowells are formed on one or more locations on the second nanostructure layer, wherein each location of the one or more locations on the second nanostructure layer shares a vertical axis with a location on the active surface of the second light detection device.

In some examples, a vertical height of the second molding relative to a bottom surface of the second substrate being at least substantially equal to a height of an active surface of the second light detection device relative to the bottom surface of the second substrate.

In some examples, a period of the light waves passed to the waveguide from the optical coupling structures of the waveguide integration layer, is selected from the group consisting of: variable and fixed.

In some examples, by at least optically coupling light waves from the light source to one or more nanowells, a specific portion of the waveguide excites a specific number of nanowells of the one or more nanowells.

In some examples, the apparatus is part of a flow cell.

In some examples, the apparatus is secured within an enclosure of a socket, the socket comprising a base portion, a plurality of electrical contacts, and a cover portion coupled with the base portion comprising at least one first port, wherein the base portion and the cover portion cooperatively form the enclosure, wherein the electrical contacts extend between the enclosure and an exterior side of the base portion, and the at least one first port extends between the enclosure and an exterior side of the cover portion, wherein the light detection device is electrically coupled to the electrical contacts of the socket.

In some examples, a vertical height of the molding relative to a top surface of the substrate is at least substantially equal to a height of an active surface of the light detection device relative to the top surface of the substrate.

In some examples, a portion of the optical coupling structures over portions of a top surface of the waveguide integration layer over the top surface of the first region comprises a first grating, and a portion of the optical coupling structures over portions of a top surface of the waveguide integration layer over the top surface of the second region comprises a second grating, wherein a first portion of the nanowells are optically coupled to the first grating, and wherein a second portion of the nanowells are optically coupled to the second grating.

In some examples, the first portion of the nanowells comprises a portion of the nanowells within a pre-defined proximity of the first grating and the second portion of the nanowells comprises a portion of the nanowells within the pre-defined proximity of the second grating.

In some examples, the first portion of the nanowells and the second portion of the nanowells comprise all the nanowells and each nanowell is in either the first portion or the second portion.

Shortcomings of the prior art can be overcome and benefits as described later in this disclosure can be achieved through the provision of a flow cell comprising: a socket comprising a base portion, a plurality of electrical contacts, and a cover portion coupled with the base portion comprising at least one first port, wherein the base portion and the cover portion cooperatively form an enclosure, wherein the electrical contacts extend between the enclosure and an exterior side of the base portion, and the at least one first port extends between the enclosure and an exterior side of the cover portion; and a light emitting device secured within the enclosure of the socket, comprising: a molding layer over a substrate and covering sides of a light detection device, wherein the molding layer comprises a first region adjacent to a first edge of an active surface of the light detection device and a second region adjacent to a second edge of the active surface of the light detection device, wherein the first region, the second region, and the active surface of the light detection device form a contiguous surface; a waveguide integration layer between the contiguous surface and a waveguide, wherein the waveguide integration layer comprises optical coupling structures on portions of a top surface of the waveguide integration layer over the top surface of the first region, and over the top surface of the second region, wherein the optical coupling structures couple light waves from a light source to the waveguide; the waveguide over the waveguide integration layer, wherein the waveguide utilizes the light waves from the waveguide integration layer to excite light sensitive materials in one or more nanowells; and a nanostructure layer over the waveguide, the nanostructure layer comprising the one or more nanowells, wherein the one or more nanowells are formed on one or more locations on the nanostructure layer, wherein each location of the one or more locations shares a vertical axis with a location on the active surface of the light detection device, wherein the light detection device is electrically coupled to the electrical contacts of the socket.

Shortcomings of the prior art can be overcome and benefits as described later in this disclosure can be achieved through the provision of a method comprising: forming a bottom layer of a flow cell, wherein the flow cell comprises a top layer and the bottom layer with a channel between the top layer and the bottom layer, the forming comprising: forming a waveguide integration layer on a contiguous surface comprised of an active surface of a light detection device, a first region of a molding layer adjacent to a first edge of the active surface of the light detection device and a second region of the molding layer adjacent to a second edge of the active surface of the light detection device, wherein the molding layer is over a substrate and covers sides of the light detection device, the molding layer having a molding height relative to a top of the substrate, the molding height being at least substantially equal to a height of an active surface of the light detection device relative to a top surface of the substrate; forming optical coupling structures in the waveguide integration layer on portions of a top surface of the waveguide integration layer over the top surface of the first region, and over the top surface of the second region; forming a waveguide layer over the waveguide integration layer, wherein the waveguide integration layer optically couples light waves from a light source to the waveguide layer, and wherein the waveguide layer utilizes the light waves from the waveguide integration layer to excite light sensitive materials in one or more nanowells; forming a nanostructure layer over the waveguide layer; and forming the one or more nanowells on one or more locations on the nanostructure layer, wherein each location of the one or more locations shares a vertical axis with a location on the active surface of the light detection device.

In some examples, forming the optical coupling structures comprises utilizing a process to generate the optical coupling structures selected from the group consisting of: imprinting and lithography.

In some examples, forming the one or more nanowells comprises utilizing a lithography process selected from the group consisting of: nanoimprint lithography and optical lithography.

In some examples, the method further comprises: forming a top layer over the nanostructure layer, wherein the top layer and the active surface collectively form a space over the nanostructure layer of the light detection device, the space defining a flow channel.

In some examples, the method further comprises: integrating a feature into the top layer, the feature selected from the group consisting of: an electrical component and a physical structure.

Additional features are realized through the techniques described herein. Other examples and aspects are described in detail herein and are considered a part of the claimed aspects. These and other objects, features and advantages of this disclosure will become apparent from the following detailed description of the various aspects of the disclosure taken in conjunction with the accompanying drawings.

It should be appreciated that all combinations of the foregoing aspects and additional concepts discussed in greater detail below (provided such concepts are not mutually inconsistent) are contemplated as being part of the inventive subject matter disclosed herein and may be implemented in and combined to achieve the benefits as provided herein.

BRIEF DESCRIPTION OF THE DRAWINGS

One or more aspects are particularly pointed out and distinctly claimed as examples in the claims at the conclusion of the specification. The foregoing and objects, features, and advantages of one or more aspects are apparent from the following detailed description taken in conjunction with the accompanying drawings in which:

FIG. 6 depicts an example of a bottom layer of a flow cell of the present disclosure, which includes both an optical waveguide and a detector;

FIG. 7 depicts an example of a bottom layer of a flow cell of the present disclosure, which includes both an optical waveguide and a detector, and also includes an additional layer with a low refractive index;

DETAILED DESCRIPTION

Figure 1:
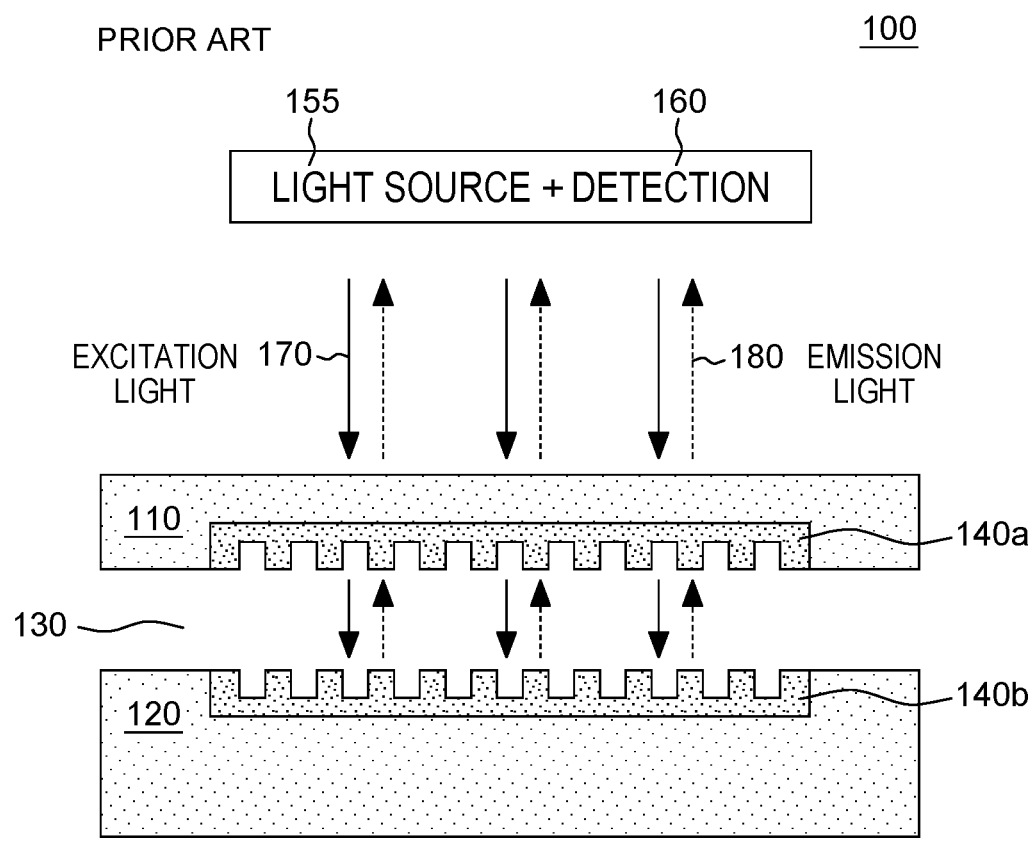
FIGS. 1-2 illustrates some example flow cells.

The accompanying figures, in which like reference numerals refer to identical or functionally similar elements throughout the separate views and which are incorporated in and form a part of the specification, further illustrate the present implementation and, together with the detailed description of the implementation, serve to explain the principles of the present implementation. As understood by one of skill in the art, the accompanying figures are provided for ease of understanding and illustrate aspects of certain examples of the present implementation. The implementation is not limited to the examples depicted in the figures.

The terms "connect," "connected," "contact" "coupled" and/or the like are broadly defined herein to encompass a variety of divergent arrangements and assembly techniques. These arrangements and techniques include, but are not limited to (1) the direct joining of one component and another component with no intervening components therebetween (i.e., the components are in direct physical contact); and (2) the joining of one component and another component with one or more components therebetween, provided that the one component being "connected to" or "contacting" or "coupled to" the other component is somehow in operative communication (e.g., electrically, fluidly, physically, optically, etc.) with the other component (notwithstanding the presence of one or more additional components therebetween). It is to be understood that some components that are in direct physical contact with one another may or may not be in electrical contact, optical contact and/or fluid contact with one another. Moreover, two components that are electrically connected, electrically coupled, optically connected, optically coupled, fluidly connected or fluidly coupled may or may not be in direct physical contact, and one or more other components may be positioned therebetween.

As used herein, a "flow cell" can include a device having a lid extending over a reaction structure to form a flow channel therebetween that is in communication with a plurality of reaction sites of the reaction structure, and can include a detection device that is configured to detect designated reactions that occur at or proximate to the reaction sites. A flow cell may include a solid-state light detection or "imaging" device, such as a Charge-Coupled Device (CCD) or Complementary Metal-Oxide Semiconductor (CMOS) (light) detection device. As one specific example, a flow cell may be configured to fluidically and electrically couple to a cartridge (having an integrated pump), which may be configured to fluidically and/or electrically couple to a bioassay system. A cartridge and/or bioassay system may deliver a reaction solution to reaction sites of a flow cell according to a predetermined protocol (e.g., sequencing-by-synthesis), and perform a plurality of imaging events. For example, a cartridge and/or bioassay system may direct one or more reaction solutions through the flow channel of the flow cell, and thereby along the reaction sites. At least one of the reaction solutions may include four types of nucleotides having the same or different fluorescent labels. The nucleotides may bind to the reaction sites of the flow cell, such as to corresponding oligonucleotides at the reaction sites. The cartridge and/or bioassay system may then illuminate the reaction sites using an excitation light source (e.g., solid-state light sources, such as light-emitting diodes (LEDs)). The excitation light may have a predetermined wavelength or wavelengths, including a range of wavelengths. The fluorescent labels excited by the incident excitation light may provide emission signals (e.g., light of a wavelength or wavelengths that differ from the excitation light and, potentially, each other) that may be detected by the light sensors of the flow cell.

Flow cells described herein may be configured to perform various biological or chemical processes. More specifically, the flow cells described herein may be used in various processes and systems where it is desired to detect an event, property, quality, or characteristic that is indicative of a designated reaction. For example, flow cells described herein may include or be integrated with light detection devices, biosensors, and their components, as well as bioassay systems that operate with biosensors.

The flow cells may be configured to facilitate a plurality of designated reactions that may be detected individually or collectively. The flow cells may be configured to perform numerous cycles in which the plurality of designated reactions occurs in parallel. For example, the flow cells may be used to sequence a dense array of DNA features through iterative cycles of enzymatic manipulation and light or image detection/acquisition. As such, the flow cells may be in fluidic communication with one or more microfluidic channels that deliver reagents or other reaction components in a reaction solution to a reaction site of the flow cells. The reaction sites may be provided or spaced apart in a predetermined manner, such as in a uniform or repeating pattern. Alternatively, the reaction sites may be randomly distributed. Each of the reaction sites may be associated with one or more light guides and one or more light sensors that detect light from the associated reaction site. In one example, light guides include one or more filters for filtering certain wavelengths of light. The light guides may be, for example, an absorption filter (e.g., an organic absorption filter) such that the filter material absorbs a certain wavelength (or range of wavelengths) and allows at least one predetermined wavelength (or range of wavelengths) to pass therethrough. In some flow cells, the reaction sites may be located in reaction recesses or chambers, which may at least partially compartmentalize the designated reactions therein.

As used herein, a "designated reaction" includes a change in at least one of a chemical, electrical, physical, or optical property (or quality) of a chemical or biological substance of interest, such as an analyte-of-interest. In particular flow cells, a designated reaction is a positive binding event, such as incorporation of a fluorescently labeled biomolecule with an analyte-of-interest, for example. More generally, a designated reaction may be a chemical transformation, chemical change, or chemical interaction. A designated reaction may also be a change in electrical properties. In particular flow cells, a designated reaction includes the incorporation of a fluorescently-labeled molecule with an analyte. The analyte may be an oligonucleotide and the fluorescently-labeled molecule may be a nucleotide. A designated reaction may be detected when an excitation light is directed toward the oligonucleotide having the labeled nucleotide, and the fluorophore emits a detectable fluorescent signal. In another example of flow cells, the detected fluorescence is a result of chemiluminescence or bioluminescence. A designated reaction may also increase fluorescence (or Förster) resonance energy transfer (FRET), for example, by bringing a donor fluorophore in proximity to an acceptor fluorophore, decrease FRET by separating donor and acceptor fluorophores, increase fluorescence by separating a quencher from a fluorophore, or decrease fluorescence by co-locating a quencher and fluorophore.

As used herein, "electrically coupled" and "optically coupled" refer to a transfer or transmit of electrical energy and light waves, respectively, between any combination of a power source, an electrode, a conductive portion of a substrate, a droplet, a conductive trace, wire, waveguide, nanostructures, other circuit segment and the like. The terms electrically coupled and optically coupled may be utilized in connection with direct or indirect connections and may pass through various intermediaries, such as a fluid intermediary, an air gap and the like.

As used herein, a "reaction solution," "reaction component" or "reactant" includes any substance that may be used to obtain at least one designated reaction. For example, potential reaction components include reagents, enzymes, samples, other biomolecules, and buffer solutions, for example. The reaction components may be delivered to a reaction site in the flow cells disclosed herein in a solution and/or immobilized at a reaction site. The reaction components may interact directly or indirectly with another substance, such as an analyte-of-interest immobilized at a reaction site of the flow cell.

As used herein, the term "reaction site" is a localized region where at least one designated reaction may occur. A reaction site may include support surfaces of a reaction structure or substrate where a substance may be immobilized thereon. For example, a reaction site may include a surface of a reaction structure (which may be positioned in a channel of a flow cell) that has a reaction component thereon, such as a colony of nucleic acids thereon. In some flow cells, the nucleic acids in the colony have the same sequence, being for example, clonal copies of a single stranded or double stranded template. However, in some flow cells a reaction site may contain only a single nucleic acid molecule, for example, in a single stranded or double stranded form.

The term "fan-out" is used herein to characterize an area that is packaged with a detector that extends a horizontal distance beyond the detector. For example, in examples where a CMOS sensor is utilized as a detector in the flow cell, the fan-out refers to the additional horizontal distance on each side of the horizontal boundaries of the CMOS sensor.

As used herein, the terms "high index material" and "low index material" refer to materials with a high refractive index (or index of refraction) and a low refractive index (or index of refraction), respectively. In optics, the refractive index or index of refraction of a material is a dimensionless number that describes how fast light propagates through the material. It is defined as where c is the speed of light in vacuum and v is the phase velocity of light in the medium. For example, the refractive index of window glass is 1.52, while the refractive index of pure water is 1.33, thus, light travels through glass slower than it travels through water. Although certain non-limiting examples are provided herein, a high refractive index material is generally agreed to be a treated glass, polymer, or chemical coating displaying a refractive index of greater than 1.50. Among the materials mentioned herein with a high refractive index is tantalum oxide (TaOx), which has a refractive index of 2.1306. Others high index material used to form a core of a waveguide are silicon nitride alloys (SiON), which may have a refractive index of 2.01. High refractive index materials are commonly integrated with materials of contrasting refractivity to form optically transparent components with anti-reflective properties. Polymers are common examples of materials with low refractive indices because the lower the refractive index, the less the material bends the light, decreasing the focusing power, the reflective effect, and the light dispersion. Thus, a polymer of an optical plastic possesses a lower (value) refractive index. For example, many materials with lower refractive indexes have indices of between 1.31 and 1.4. Generally speaking, materials with a refractive index that is less than 1.50 are termed low index materials.

As used herein, the term "substantially" refers to small fluctuations (e.g., ±5% or less), as well as no fluctuations (i.e., ±0%).

Reference is made below to the drawings, which are not drawn to scale for ease of understanding, wherein the same reference numbers are used throughout different figures to designate the same or similar components.

Figure 2:
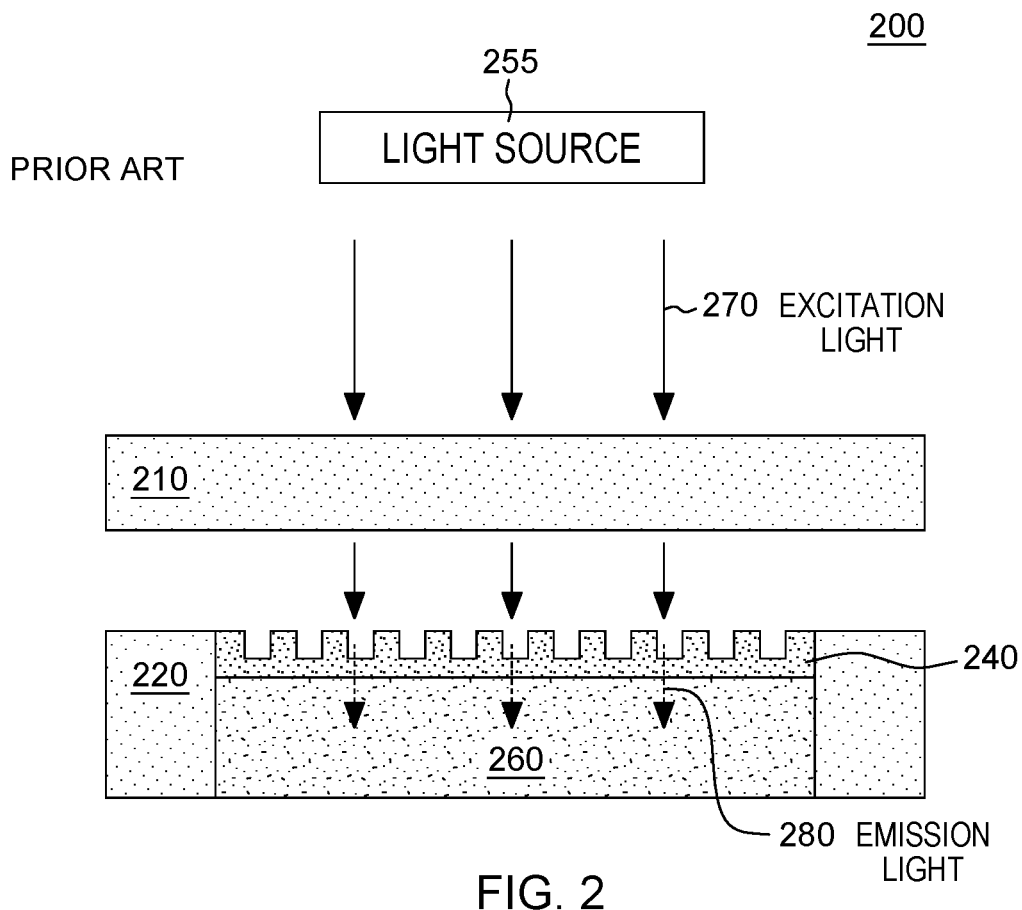

In a case of an existing flow cell, a light source is situated above a top flow cell layer. The bottom layer of the flow cell includes a sensor or detector (e.g., a CMOS sensor), and the light source is situated above this layer. When the detector in the flow cell is a CMOS, in existing flow cells, there are certain limitations in the performance of some processes performed using the flow cell, such as SBS. FIGS. 1-2 depict these existing structures and illustrate these limitations. FIGS. 1-2 both depict flow cells 100, 200 where a top layer 110, 210 and a bottom layer 120, 220 face each other. The headspace between these layers defines a channel 130, 230 where reagents for a sequencing operation (e.g., SBS) can be dispensed. The flow cell 100 of FIG. 1 additionally includes a nanostructure 140a-140b on each layer of the top layer 110 and the bottom layer 120, where the surfaces of the nanostructures 140a-140b are directed towards the channel 130, 230. The nanostructures 140a-140b are depicted in greater detail in FIG. 3.

Referring to FIG. 1, in this flow cell 100 a combination light source 155 and detector 160 is positioned over the top layer 110 such that excitation light 170 and emission light 180 can move between the light source 155 and detector 160 and the top layer 110 and the bottom layer 120. Specifically, the excitation light 170 coming from the light source 155 propagates towards the nanostructured surfaces 140a-140b (e.g., two sequencing surfaces) where DNA strands being sequenced reemit an emission light 180 based on the characteristics of the last nucleotide incorporated in the DNA strand. This emission light 180 propagates back to the detector 160. In the flow cell 200, the nanostructured surfaces 140a-140b can be utilized to sequence simultaneously.

Referring to FIG. 2, rather than utilizing two nanostructures 140a-140b (FIG. 1), the flow cell 200 includes a detector 260 that is a CMOS sensor, so there is only one nanostructure 240. In one example the detector 260 is a light detection device comprising a CMOS sensor. Utilizing a CMOS sensor as a detector 260 provides performance advantages in SBS. Because of the presence of the CMOS sensor as a detector 260, flow cells utilizing this element are referred to as CMOS-based flow cells in some examples herein. For this flow cell type, a light source 255 is placed over the top layer 220. The light source 255 sends an excitation light 270 that propagates to the nanostructure 240 surface. The polynucleotide strands (e.g., DNA) being sequenced by the flow cell 200 then can reemit an emission light 280 that propagates downward to the detector 260 (e.g., CMOS sensor) placed in the bottom layer 220. It is noted that while the term "DNA strand" is used herein, the term is only meant to illustrate a representative example of a polynucleotide, which can include other types of molecules, such as RNA.

Figure 3:
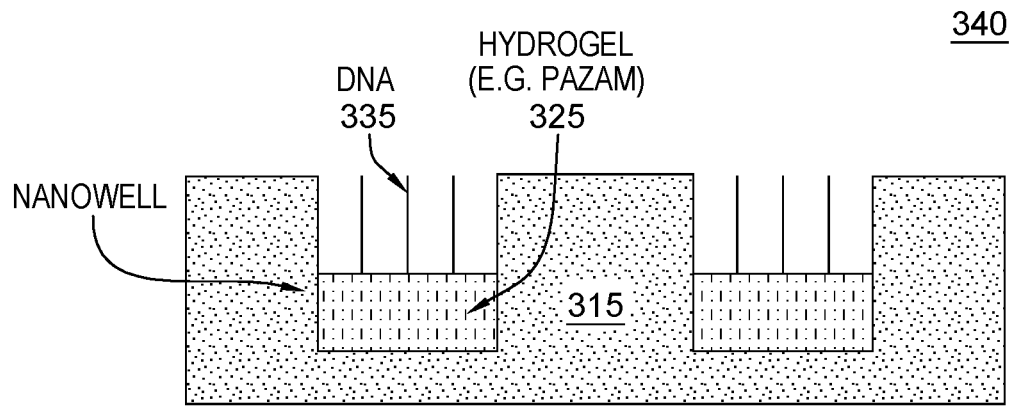
FIG. 3 depicts examples of nanostructures utilized in some flow cells.

Referring to FIG. 3, each nanostructure 340 (e.g., nanostructure 140a-140b (FIG. 1), nanostructure 240 (FIG. 2)) is comprised of nanowells 315, which comprise a hydrogel 325 with primers that anchor DNA strands 335 that are to be sequenced.

In order to function effectively, the technical architecture of the existing flow cells 100, 200 include certain elements that of FIGS. 1-2 impact the overall efficacy and performance of the flow cells 100, 200. For example, the integration of performance enhancing features, including but not limited to electrical components (e.g., electrodes) and/or physical structures (e.g., herringbone trenches) into the top layer 110, 210 of the flow cells 100, 200 can help achieve faster SBS kinetics. Because these features are non-transparent optically, light diffusive and/or light scattering, they will not positively impact the performance of the flow cells 100 200 because they can block or perturb the excitation or emission light paths. While the non-CMOS flow cell 100 of FIG. 1 utilizes two sequencing surfaces, nanostructures 140a-140b, the flow cell 200 of FIG. 2 do not benefit from this dual-sequencing surface architecture because introducing a second sequencing surface in the top layer 210 may be optically non-transparent, light diffusive and/or light scattering and adversely affect the performance of the flow cell 200. Thus, the CMOS-based flow cell 200 of FIG. 2 is precluded from including two sequencing surfaces, lowering the quantity of data acquired, based on the placement of the light source 155 and the proposed second surface interfering with the light paths.

Referring to FIGS. 1-2, because the functionality of the flow cells 100, 200 is in part dependent on the light paths emanating (and in some cases, returning) to the position of the light source 155, 255, in both existing flow cells 100, 200, in order to achieve optimal performance, the flow cell 100, 200 top layer 110, 210 cannot block, extensively diffuse and/or scatter: 1) the excitation light 170, 270 travelling from the light source 155, 255 to the DNA clusters (at the nanostructures 140a-140b 240) to be sequenced; and/or 2) the emitted light 180, 280 travelling from the DNA clusters (at the nanostructures 140a-140b, 240) to be sequenced, to a detector 160, 260.

Figure 4:
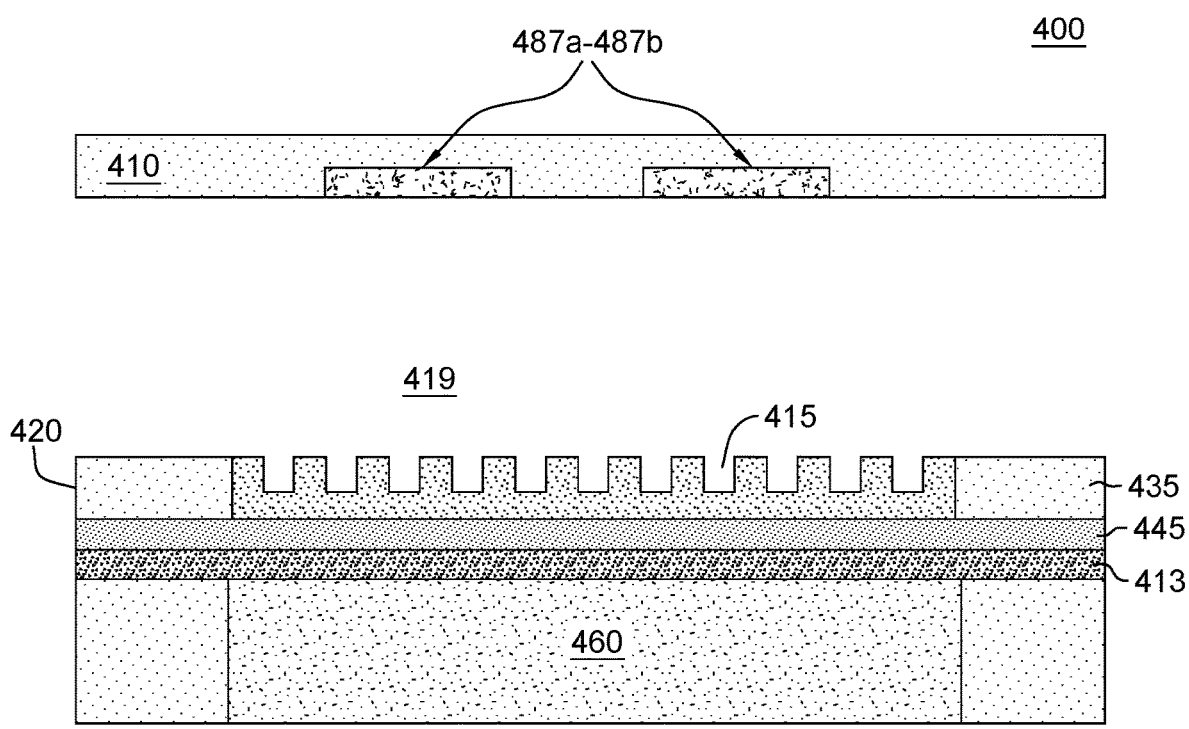
FIG. 4 depicts, in part, an example of a bottom layer of a flow cell in the present disclosure, where a waveguide integration layer integrates a waveguide with a detector.
Figure 5:
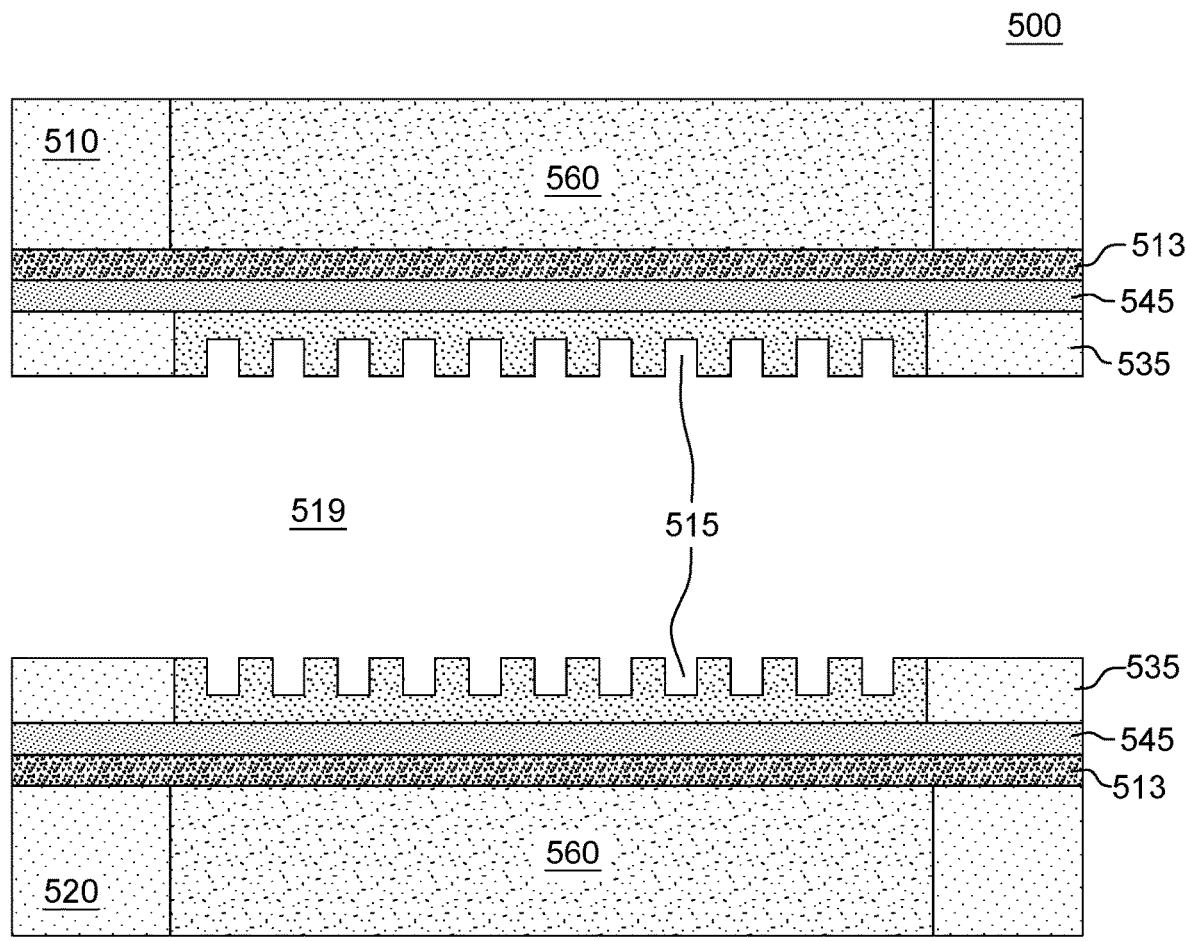
FIG. 5 depicts various aspects of an example of a flow cell in the present disclosure, where dual-sequencing is enabled.

FIGS. 4-5 depict aspects of various examples, where a waveguide 445 is formed over a detector 460 (e.g., a CMOS sensor). The utilization of a "CMOS sensor" in various examples in this disclosure is only provided by way of example and other types of sensors, e.g., solid-state sensors such as CCD sensors, can be employed pursuant to the disclosure. Examples of implementations in this disclosure utilize waveguides that are referred to as planar waveguides or slab waveguides. A planar waveguide is a waveguide that with a planar geometry, meaning that it guides light only in one dimension. As described herein, the waveguides in various implementations, including the waveguide 445 in FIG. 4, can be fabricated in the form of a thin optically transparent film with an increased refractive index. Another type of waveguide that can be implemented in various examples disclosed herein is a slab waveguide, which is also a planar waveguide, but a slab waveguide consists of three dielectric layers with different refractive indices and confines waves to one direction.

Returning to FIGS. 4-5, by forming a waveguide 445 over a detector 460, the waveguide can propagate the excitation light from a light source to the nanowells 415. In the bottom layer 420, 520 of FIGS. 4-5 and the top layer 510 of FIG. 5, the excitation light from the nanowells 415, 515 can propagate to the detector since the waveguide does not hinder light propagation. Additionally, as discussed below, this configuration of the detection and illumination enable the integration of additional performance enhancements into the flow cell. In FIG. 4, a top layer 410 includes performance enhancing features. In FIG. 5, a dual-sequencing surface architecture is enabled.

FIG. 4 depicts, in part, a bottom layer 420 of a flow cell, where a waveguide integration layer 413, which is a low index material (i.e., a material with a low refractive index), integrates the waveguide 445 in this bottom layer 420 with a detector 460 (e.g., CMOS sensor). The waveguide integration layer 413, which can be a stack of layers rather than a single layer, couples the light to the waveguide 445, which guides the light inside of the waveguide to the nanostructure layer 435, exciting light sensitive material in the nanowells 415. In the example of FIG. 4, the illumination and detection capabilities are integrated together in the same layer, the bottom layer 420. As illustrated in FIG. 2, in existing CMOS-based flow cells, the illumination component, light source 255, is situated above the detection component, detector 260. By combining the illumination and detection functionality into a bottom later 420 of a flow cell, the resultant flow cell can minimize, and in some instances even eliminate, the need, as well as the limitations imposed by involving a light source over the layer, as seen in FIG. 2. As depicted in FIG. 4, because this light source placement limitation is avoided by including the waveguide 445 and the detector 460 in the bottom layer 420, a flow cell comprising the bottom layer 420 can include a top layer 410 with optically non-transparent features 487a-487b, including but not limited to, electrical components (e.g., electrodes) or physical structures (e.g., herringbone trenches). The integration of these performance enhancing features can help achieve faster SBS kinetics and positively impact the performance of the flow cells into which the top layer 410 and bottom layer 420 are integrated.

As aforementioned, the non-CMOS flow cell 100 of FIG. 1, can utilize two sequencing surfaces, nanostructures 140a-140b, but the flow cell 200 of FIG. 2 does not benefit from this dual-sequencing surface architecture because introducing a second sequencing surface in the top layer 210 may be optically non-transparent, light diffusive and/or light scattering and adversely affect the performance of the flow cell 200. However, in FIG. 5, because the top layer 510 and the bottom layer 520, which each include a detector 560, which is a CMOS sensor, in this example, and a waveguide 545, this limitation can be mitigated, and in some instances even eliminated. FIG. 5 depicts a flow cell that integrates this top layer 510 and bottom layer 520 with a flow channel 519 formed between the top layer 510 and the bottom layer 520. Each of top layer 510 and bottom layer 520 is a sequencing surface including nanowells 515. The sequencing surfaces of the top layer 510 and the bottom layer 520 can perform SBS simultaneously and/or in parallel.

While FIGS. 4-5 depict, generally, certain aspects of some examples of a bottom layer of a flow cell, as disclosed herein, and illustrate the inclusion of a light source and a detector in a common layer (e.g., bottom layer 420, top layer 510, and bottom layer 520), FIGS. 6-12 provide additional details regarding some examples in this disclosure of a bottom layer of a flow cell and its inclusion in a flow cell.

FIG. 6 is a bottom layer 620 of a flow cell that comprises various aspects of some examples, where obscuring light paths to a light source is avoided by utilizing an optical waveguide 645 to provide both illumination (waveguide 645) and detection (detector 660, which is comprised, in this example, of a CMOS sensor) in a bottom layer 620 of a flow cell. As stated earlier, the CMOS sensor is provided by way of example other types of sensors (e.g., solid-state sensors such as CCD sensors) can be employed pursuant to this disclosure. As will be explained herein, by reducing, or in some instances even eliminating, this performance issue, some examples comprise CMOS-based flow cells, which can be used to achieve faster SBS kinetics through the utilization of technical architectures and/or the integration of features, which adversely affect performance in existing CMOS-based flow cells (e.g., flow cell 200 (FIG. 2)), based on the architectural constraints imposed by the placement of the light source (e.g., light source 255 (FIG. 2)) over the top layer (e.g., top layer 210, FIG. 2) of the flow cell. The integration of the optical waveguide 645 with a detector 660, in the bottom layer 620 of a flow cell, as illustrated in FIG. 6, provides various benefits to the flow cell into which the combined layer is integrated (e.g., the bottom layer 620). Two of these benefits are discussed herein. First, integration of the optical waveguide 645 with a detector 660 in the bottom layer 620 enables the signal to noise ratio (SNR) to be increased by utilizing a thinner long path/pass (LP) structure, reducing the absorption and providing for the usage of conventional LP materials (e.g., silicon mononitride (SiN)), which can significantly increase the light collection from the nanowells 615 into the detector 660 (e.g., the pixels). Second, integrating the optical waveguide 645 with a detector 660 into the bottom layer 620 enables a simple and robust solution for multi-cluster nanowells 615 (per pixel). The former structural change/advantage can reduce the cost of the flow cell overall because the increased SNR and resulting architecture changes enable ongoing smaller nanowells 615 (e.g., pixel sizes), reducing the costs.

As depicted in FIG. 6, a grating 611 on a waveguide integration layer 613 below the waveguide 645, i.e., the core waveguide layer, is not formed on or immediately over the detector 660, in this example, a CMOS sensor. In some examples, the waveguide integration layer 613 can comprise more than one layer and one of these additional layers can act as a planarization layer or act as an optical filter. In order to couple light into a (planar) waveguide 645, a grating 611 is formed on a substrate that diffracts the light into the propagating direction (modes) of a waveguide 645. To achieve high efficiency and high tolerance room (on the angular direction of the light incident on the grating 611) the size of the coupling structure (e.g., grating 611) plays a role; it is designed to be larger. Implementing an optical coupling structure, such as a grating, on a surface 611 (or immediately over a surface) of a CMOS sensor both decrease the useful region of the sensor and increase the cost of the sensor. The resultant flow cell, with the coupling structure effectively obscuring part of the surface of the CMOS sensor, to couple an external light source (e.g., LED or laser) into the waveguide, present these challenges and have a low overall efficiency. Thus, in the example of FIG. 6, rather than form a coupling structure (e.g., grating 611) for a waveguide 645 on a CMOS sensor (the detector 660 can be comprised of a CMOS sensor in some examples), this structure is formed in an area outside of the CMOS sensor. Additionally, utilizing gratings 611 to couple the light into a waveguide, with the area that comprises the gratings 611 being outside the CMOS area (i.e., not on the active surface 657 of the CMOS sensor) enables the formation of flow cells with smaller CMOS sensors. The area comprising the optical coupling structures, the gratings 611, can be expanded without requiring a larger CMOS sensor and expanding the grating area can be advantageous to functionality because a larger grating area helps align the light source (e.g., laser or LED) to couple the light into the waveguide 645. A larger area introduces a larger tolerance of the laser relative to the surface and also enables variation of the period of the light source within the regions in the waveguide 645.

Referring to FIG. 6, the bottom layer 620 of the flow cell depicted includes a coupling structure (e.g., grating 611) that couples light into the waveguide 645, which guides the light inside of the waveguide to the nanostructure layer 635, exciting light sensitive material in the nanowells 615. The coupling structure (e.g., grating 611) is formed in a low index layer (i.e., a material with a low refractive index, including but not limited to, silicon oxide (e.g., 1.4585), silicon oxynitride (e.g., 1.45), and/or a polymer based material) referred to herein as a waveguide integration layer 613 over two regions of molding 616, a first region 612a, on one side of the detector 660 and parallel to the active surface 657 of the detector 660, and a second region 612b, one the opposing side of the detector 660 and also parallel to the active surface 657 of the detector 660. In some examples of the disclosure, the vertical height of the first region 612a and the second region 612b of the molding 616, relative to a substrate 624 are at least substantially equal to a height of the active surface 657 of the detector 660.

Although in some examples, including in FIGS. 6, 7, 8A-8G, 9, 11 and 12 in the depicted bottom layers, regions of molding 612a-612b, 712a-712b, 812a-812b, 912a-912b, on the sides of the active surfaces 657, 757, 857, 957 of the detectors 660, 760, 860, 960 are not depicted to overlap the detectors 660, 760, 860, 960, in some embodiments, these regions of molding that form on the sides of the active surface of a detector can overlap a portion of the active surface of the detector. The term "contiguous surface" is used herein to characterize a surface that includes the top surfaces of the molding regions and the active surface of a detector (e.g., in FIG. 6, the first region 612a, the active surface 557, and the second region 612b). The term "contiguous surface" can imply or not imply a consistent horizontal axis. In some examples, the height of the regions can exceed the height of the detector and/or the active surface of the detector can comprise portions on more than one horizontal plane. In these examples, the waveguide integration layer planarizes this contiguous surface (the portion of the detector that is not covered by the regions and the regions), and creates a plane upon which the waveguide can be formed. In other examples, as illustrated in FIGS. 6, 7, 8A-8G, 9, 11 and 12, the regions do not overlap any portion of the active surface of the detector. In some examples, based on the geometry of the detector, the active surface and the regions of molding, the latter of which do not overlap the active surface, form a contiguous surface of a consistent vertical height. The term "contiguous" thus represents a sequence of areas: a first molding region, a portion of the active surface of a detector, and a second region of molding, rather than suggesting any structural conformity among these areas.

Returning to FIG. 6, a waveguide integration layer 613 covers the detector 660 as well as the first region 612a and the second region 612b of molding 616, on either side of the detector 660. In the example of FIG. 6, a core waveguide layer, the waveguide 645, is a high index layer comprising a high index material (i.e., a material with a high refractive index, including but not limited to, tantalum oxide (TaO$_x$), polymer-based, dielectric oxide, etc.) that is formed over the waveguide integration layer 613 and integrated utilizing the coupling structure (e.g., grating 611). A nanostructure layer 635, which is also a layer of a low index material (i.e., a material with a low refractive index), is formed over the waveguide 645. Because a high index material comprises a high refractive index, the waveguide 645, which is a higher index material that can be optically transparent, excites the fluorescent light, which is in-between two lower index materials. In some examples of the disclosure, rather than the waveguide 645 and the nanostructure layer 635 being separate layers, nanowells 615 are formed on the waveguide 645.

The first region 612a and the second region 612b of the molding 616 are just two examples of placements for optical coupling structures that couple light to a waveguide 645, in some examples. Further examples provide different orientations for these regions of optical coupling structures. The commonality between the various examples is that these regions do not overlap with an entirety of the active surface 657 of the detector 660.

Returning to FIG. 6, the nanostructure layer 635 includes nanowells 615, as depicted in FIG. 3. In some examples, the nanowells 615 are formed by either imprinting and/or lithography, in some examples, the lithography includes, but is not limited to, nanoimprint lithography and/or optical lithography. Some examples also include photodiodes 681 in the detector 660 situated under the nanowells 615 of the nanostructure layer 635.

As depicted in FIG. 6, in some examples, a first redistribution layer (RDL) 621 is formed on the detector 660. The first RDL 621 is an example of a backside contact that can be joined to the detector 660. A second RDL 631 is connected to the first RDL 621. Each RDL can be composed of a metal, including but not limited to, tungsten, copper, gold, nickel, and/or other similar materials. The first RDL 621 and the second RDL 631 are connected by electrical vias 643 (e.g., a through-silicon via (TSV)). In some examples, the electrical vias 643 are copper bumps. As illustrated in FIG. 6, the first RDL is deposited on the detector 660 and the second RDL 631 is deposited on the molding package. The molding package includes the detector 660 as well as the molding 616. The second passivation layer 624 can include multiple layers, such that it is a passivation stack, rather than a singular passivation layer 624. Examples can include a TSV extending through the bottom layer 620 light detection device and electrically connecting a substrate to the second RDL 631, which is in electrical contact with a substrate joined to the bottom layer 620 with a substrate bond pad, e.g., part of the optional layer 626.

Beyond the second passivation layer 624 on a common horizontal plane, is a fan-out passivation layer 672. The fan-out passivation layer 672 passivates the second RDL 631, this second RDL 631 being disposed on a bottom surface of the base substrate. In some examples, the fan-out passivation layer 672 comprises a polyamide (a synthetic polymer), a solder mask, and/or another epoxy. In some examples, an optional layer 626 is deposited on an RDL opening of the fan-out passivation layer 672. In some examples, the optional layer 626 can include a second metal coating, referred to as under bump metal (UBM). This second metal coating is about the same size as the passivation opening on the passivation layer 672.

FIG. 6 represents a bottom layer 620 with a minimum number of layers: a low index layer 613 with optical coupling structures 611, a high index core waveguide 645 layer, and a second low index layer 735, over the high index layer, in which, in FIG. 6, nanowells 615 are formed. However, in other examples, a bottom layer of a flow cell comprises additional layers, including one or more additional low index layers (i.e., layers comprised of material(s) with a low refractive index) between the waveguide 645 and the low index layer 635 in which nanowells 615 are formed.

FIG. 7 is an example with one additional low index layer 766, however, further examples comprise additional low index layers. For example, in some examples, one or more layers are formed between the waveguide integration layer 713 and the contiguous surface that comprises regions 712a-712b on either side of the active surface 757. FIG. 7 is merely used as an illustrative example of an example of an additional layer 766 in a given orientation; additional layers can be added to various examples at various orientations.

FIG. 7 is another example of a bottom layer 720 which can be utilized in a flow cell, in accordance with various aspects of some examples. Referring to FIG. 7, in some examples, there is another layer, an additional low index layer 766, between the planar waveguide 745 and the nanostructure layer 735, thus, two layers with a lower index can refract the light. Thus, a difference between the example in FIG. 7 and the bottom layer 620 of FIG. 6 is that in FIG. 7, the bottom layer 720 includes an additional low index layer 766 formed between the core waveguide layer, the waveguide 745, and the nanostructure layer 735, which includes the nanowells 715. In this example, the nanostructure layer 735 can be either high index or low index. (The waveguide 645 is high index in the bottom layer 620 in FIG. 6.) The bottom layer 720 includes a detector 760 with photodiodes 781 and includes molding 716 that comprises regions 712a-712b on either side of the active surface 757 of a detector 760. It is over these regions 712a-712b that a waveguide integration layer 713 is formed with gratings 711 that couple this layer to the waveguide 745. Above the waveguide 745 the additional low index layer 766 is formed and on this layer, the nanostructure layer 735 with nanowells 715. The gratings 711 optically couple light to the nanowells 715.

As with the bottom layer in the example depicted in FIG. 6, in the examples depicted in FIG. 7, a first RDL 721 (deposited on the detector 760) is formed on the detector 760 and second RDL 731 (deposited on the package) is connected to the first RDL 721 via an electrical vias 743 (e.g., copper bumps). The second passivation layer 724 can include multiple layers forming a passivation stack. Adjacent to the second RDL 731 is a fan-out passivation layer 772 (e.g., a polyamide, a solder mask, and/or another epoxy), which passivates the second RDL 731. An optional layer 726 can be deposited on an RDL opening of the fan-out passivation layer 772. The optional layer 726 can include a second metal coating, referred to as under bump metal (UBM). This second metal coating is about the same size as the passivation opening on the passivation layer 724.

FIGS. 8A-8G depict various aspects the formation of the bottom layer (e.g., bottom layer 620, FIG. 6) in some examples. As depicted incrementally in FIG. 8A-8G, a low index layer (e.g., a resin), waveguide integration layer 813, is formed and this (e.g., resin) layer planarizes a mold fan-out wafer/panel to create a bottom cladding of a waveguide 845. This plane upon which the waveguide integration layer 813 is formed comprises the active surface 857 of a detector 860 (e.g., a CMOS sensor), and a fan-out region of molding 812a-812b on each side of this active surface 857. The molding 816 and the detector 860 comprise a molding package. In some examples, optical coupling structures such as gratings 811 are formed on the waveguide integration layer 813 utilizing one or more of the following techniques: imprinting, lithography, and/or etching. The waveguide 845 itself is a high index layer (e.g., TaO$_x$), which is formed on the waveguide integration layer 813, to make the core of the waveguide 845. In some examples, the waveguide 845 layer is patterned to make channel waveguides. In some examples, the waveguide 845 is a slab waveguide. A top cladding is then formed by a nanostructure layer 835, which can be another resin layer and/or a dielectric layer, upon which nanowells 815 are imprinted. In some examples, nanowells can be formed on the waveguide 845 layer itself.

Figure 8A:
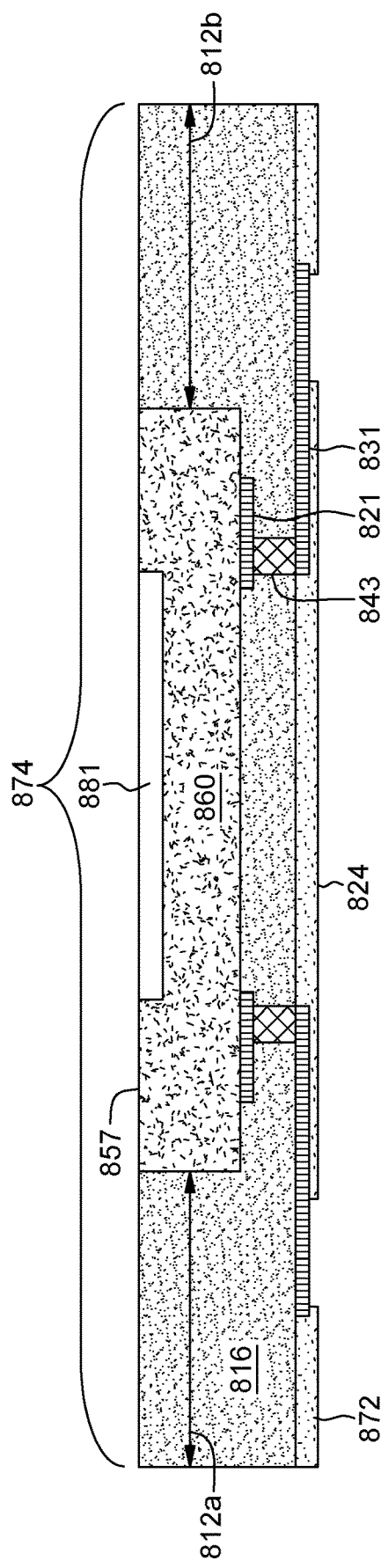
FIGS. 8A-8G illustrate a process of forming an example of a bottom layer of a flow cell of the present disclosure.

Referring first to FIG. 8A, depicted is a mold fan-out general structure 874 before the addition of the waveguide 845 or the nanostructure layer 835, which are utilized, in a flow cell, to perform SBS. The general mold fan-out structure 874, also referred to herein as the molding package, includes both the detector 860 and the molding 816. Included in the mold fan-out general structure 874 are a second RDL 831 (deposited on the molding 816), connected to a first RDL 821 (deposited on the chip comprising the detector 860), via an electrical vias 843 (e.g., copper bumps). The second RDL 831 is in contact with a second passivation layer 824. An optional layer 826 is also included in this example and was deposited on an RDL opening of a fan-out passivation layer 872.

Figure 8B:
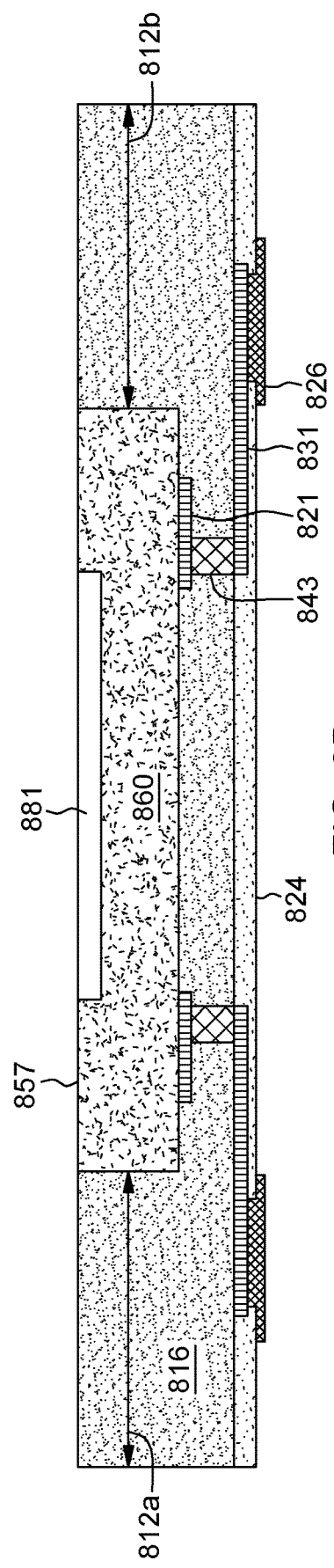

Referring to FIG. 8B, an optional layer 826, which in this example is a UBM, is formed on the second RDL 831. The second RDL 831 can comprise more than one layer and can be understood as a stack.

Figure 8C:
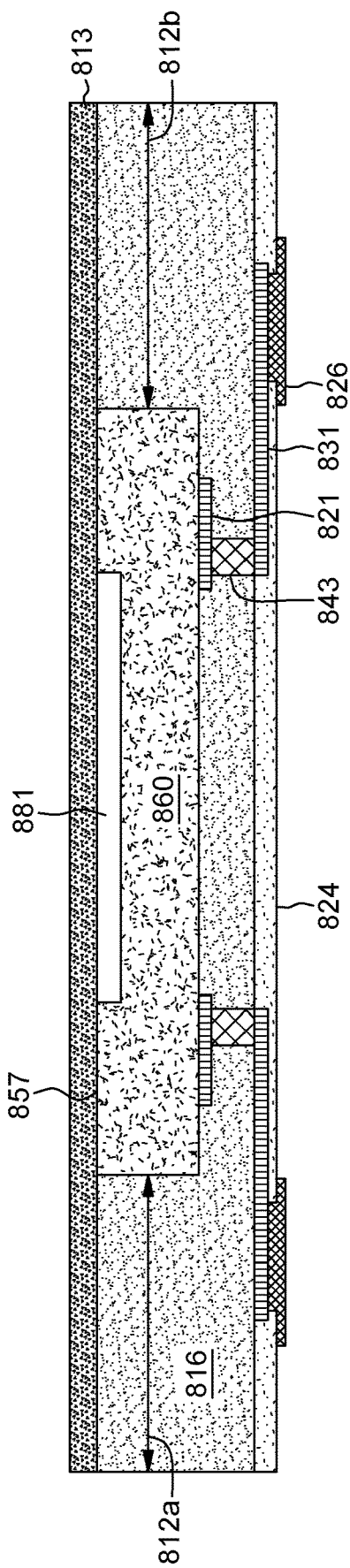

FIG. 8C depicts the start of the waveguide integration into the bottom layer. The waveguide 845 (see FIGS. 8E-8G) is ultimately integrated onto the plane comprising the active surface 857 of a detector 860, and a fan-out region of molding 812a-812b on each side, with the addition of a waveguide integration layer 813, which can comprise a low index material, such as a resin. As discussed above, the waveguide integration layer 813 can actually be a stack of layers rather than a single layer, where the different layers of the stack provide different functions and only one layer includes the optical coupling structures (gratings 811, FIGS. 8D-8G). For example, in some examples, this stack can include one or more layers that act to planarize the waveguide. Some layers can act as optical filters. Some layers can act as a low index cladding of the waveguide.

Figure 8D:
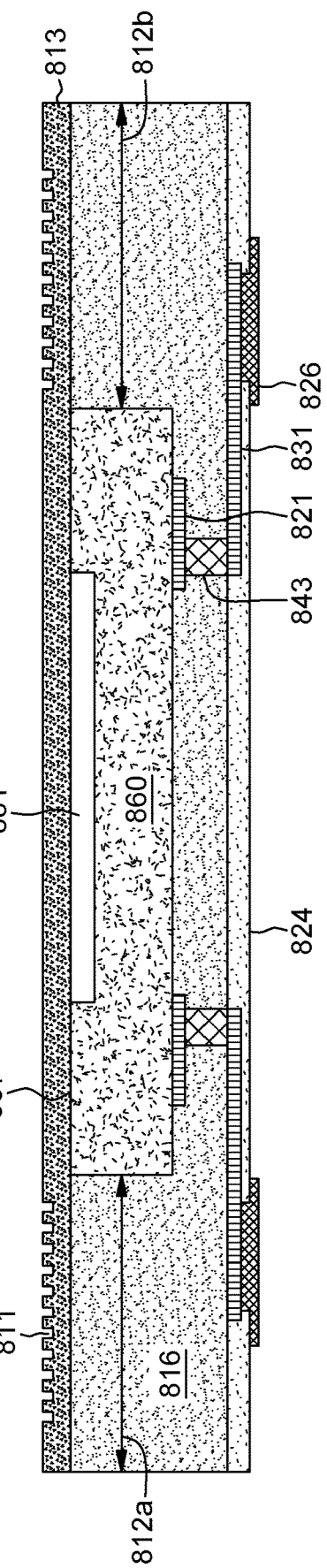

In FIG. 8D, optical coupling structures are formed on the waveguide integration layer 813. The type of optical coupling structures which are depicted in FIGS. 8D-8G are gratings 811. Various processes can be utilized to form these optical coupling structures, including but not limited to, lithography, photolithography, imprinting, nano-imprinting, and/or etching. These optical coupling structures, in this case, gratings 811, couple the light into the waveguide 845. This waveguide integration layer 813 can be formed by deposition of the material comprising this layer and can comprise one of more of silicon oxide, silicon oxynitride, and/or a polymer based material.

Figure 8E:
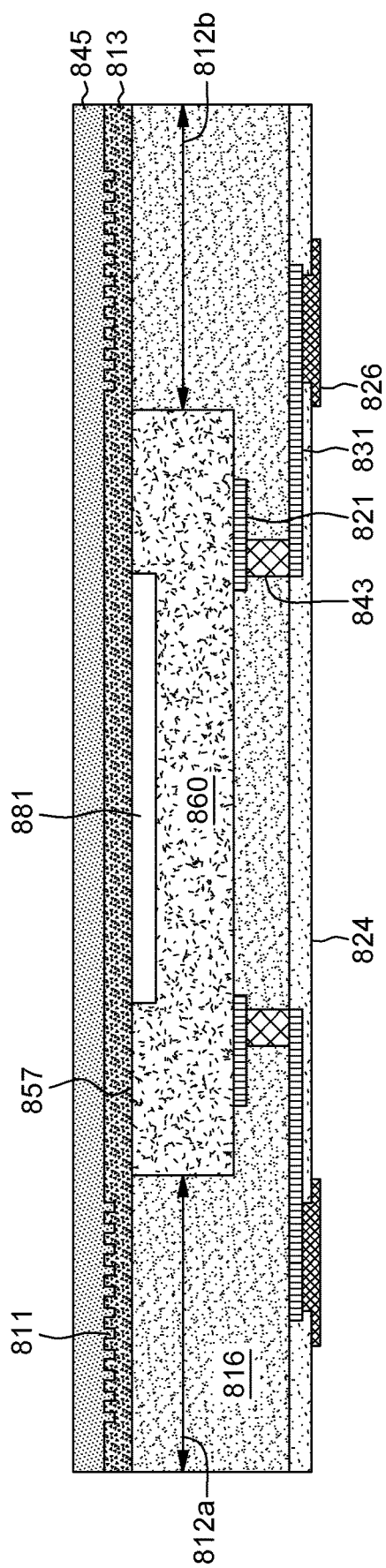

Once the optical coupling structures (e.g., gratings 811) have been formed, the core of the waveguide 845 can be added to the bottom layer. As depicted in FIG. 8E, in an example in this disclosure, a waveguide 845 layer is formed comprising a high index material (e.g., $TaO_x$). The coupling of the gratings 811 with the waveguide 845 enable the gratings 811, as aforementioned, to couple the light (and/or other spectral wavelengths) into the waveguide 845, which is a high index layer, such that light is propagated throughout the waveguide 845, enabling such the light to excite sensitive material in the nanowells 815 (FIG. 8G) (e.g., fluorescently-labeled analytes).

Figure 8F:
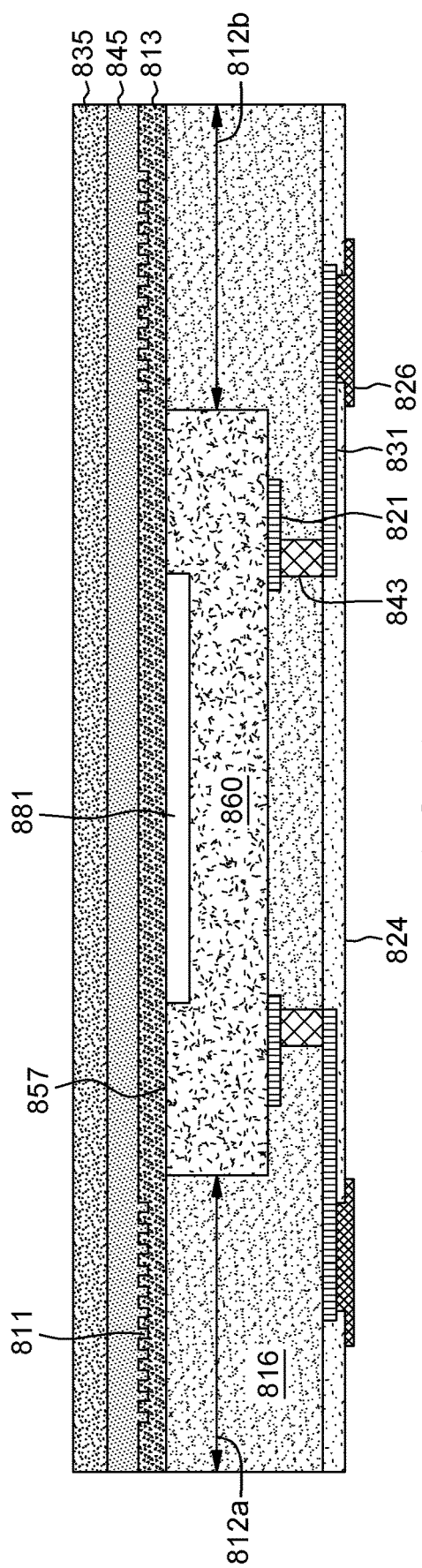

In the example of the partial bottom layer depicted in FIG. 8F, what will become the nanostructure layer 835 is formed over the waveguide 845 layer. The nanostructure layer 835 is a low index layer that can be comprised of a resin or dielectric materials.

Figure 8G:
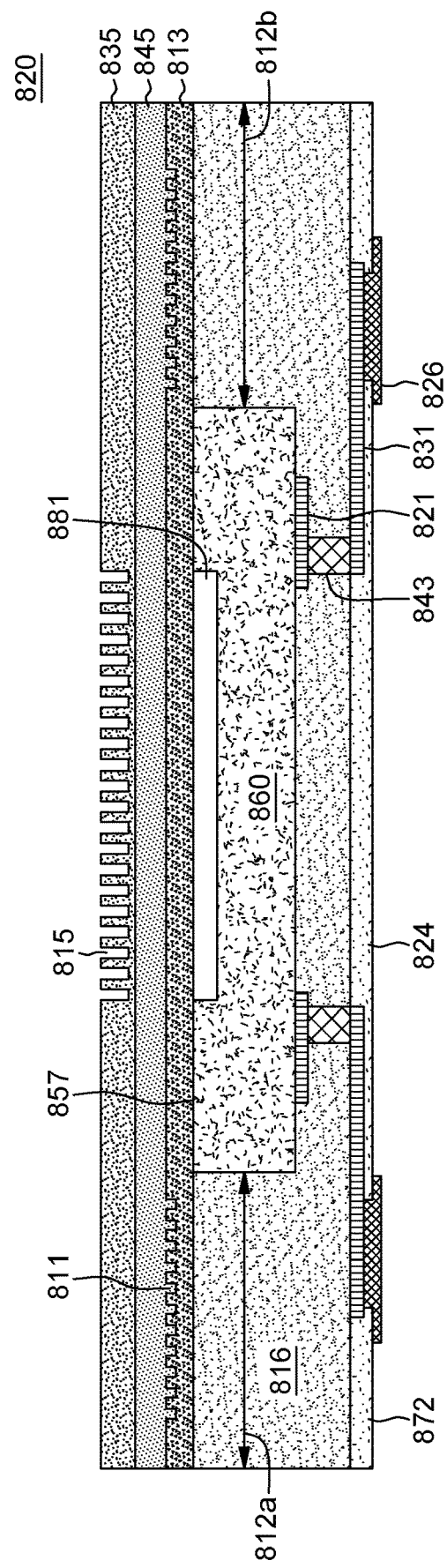

Referring to FIG. 8G, which comprises the bottom layer 820 of a flow cell, nanowells 815 are formed in the nanostructure layer 835 of the bottom layer 820 to be utilized in the flow cell. The nanowells 815 are located on the nanostructure layer 835 such that photodiodes 881 in the detector 860 are positioned under the nanowells 815. In some examples each nanowell of the nanowells 815 corresponds to a predetermined number (1-2) of photodiodes 881 located beneath the nanowells 815.

In some examples, rather than utilize a first low index layer above the waveguide 845 as a nanostructure layer 835, on or more additional low index layers can be formed between the eventual nanostructure layer 835 and the waveguide 845.

Figure 9:
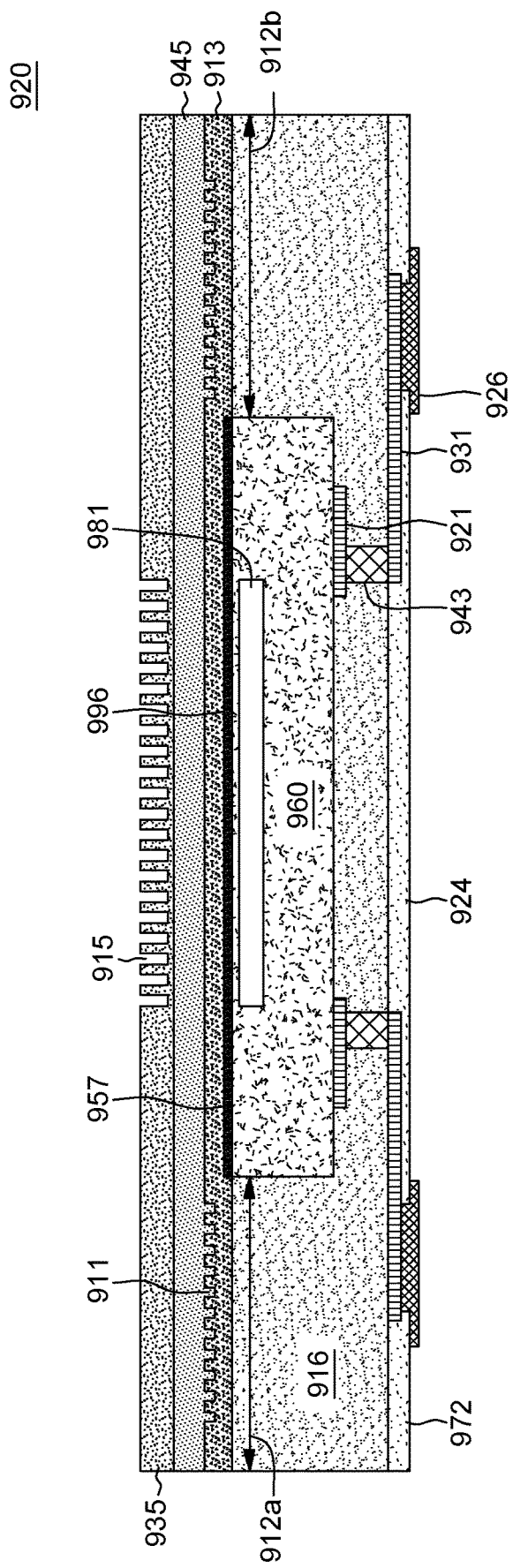
FIG. 9 depicts an example of a bottom layer of a flow cell of the present disclosure, which includes both an optical waveguide and a detector, and also includes a light guide.

As depicted in FIG. 9, the gratings 911 (optical coupling structures) optically couple the light to the waveguide 945, and the waveguide 945 provides excitation light to the nanowells 915. FIG. 9 also depicts a light guide 996, which can include one or more filters, for filtering certain wavelengths of light. In various examples, the light guide 996 can be, an absorption filter (e.g., an organic absorption filter) such that the filter material absorbs a certain wavelength (or range of wavelengths) and allows at least one predetermined wavelength (or range of wavelengths) to pass therethrough. As discussed above, the waveguide integration layer 913, is a low index layer that includes the gratings 911 (i.e., grating regions) that refract the light into certain predetermined directions. Across various examples, the period of the light refracted from the grating structure (i.e., gratings 911) can vary to help align the light in a manner that manages it into the waveguide 945. In some examples, the period is varied across the length of the grating area. In some examples, the period can be fixed.

Figure 10:
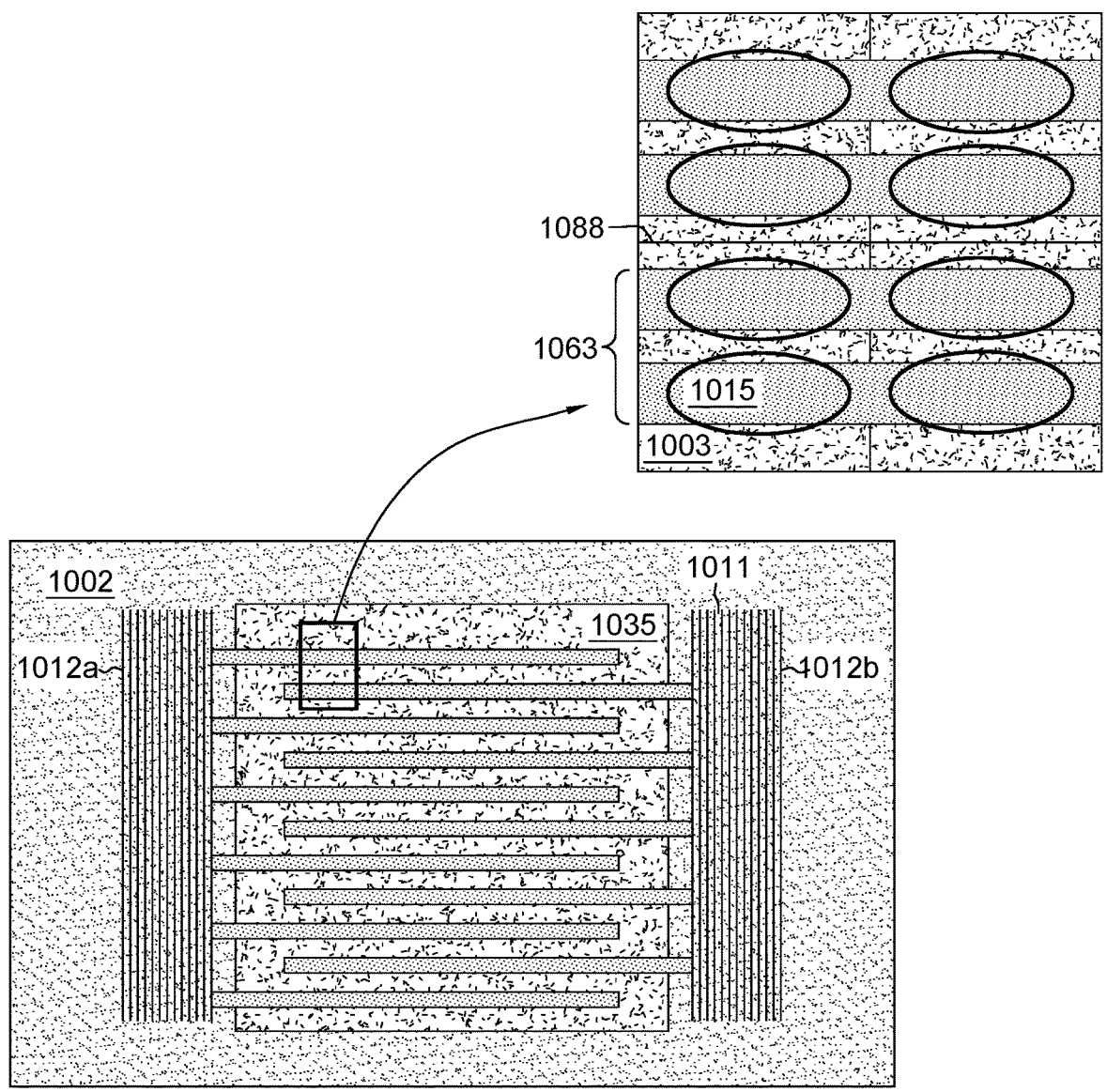
FIG. 10 illustrates a top-view of an example of a bottom layer of a flow cell in accordance with some examples of the present implementation.

FIG. 10 comprises a top-view 1001 of a bottom layer that can be integrated into a flow cell, in accordance with some examples. The top-view 1001 includes a general top view 1002 and a zoomed view 1003 into a region of the nanowells 1015 of the nanostructure layer 1035. As aforementioned, photodiodes, which detect emission light from the nanostructure layer 1035, reside in a detector (not pictured), such as a CMOS sensor. These photodiodes act as light sensors and can be regarded as pixels, which activate during a biological or chemical test in a flow cell. The nanowells 1015 in the nanostructure layer 1035 can be configured to each align with a given number of photodiodes or pixels. In some examples, two nanowells 1015 are aligned with a given light sensor (pixel) in the CMOS sensor. The zoomed view 1003 depicts a given region 1063, differentiated by a border 1088, for visual purposes only, a 2×2 pixel region, where two nanowells 1015 are assigned to each pixel (or light sensor).

Referring to FIG. 10, as illustrated in the zoomed view 1003, portions of the waveguide that provide excitation light to certain nanowells 1015 are optically coupled to either the grating 1011 over the first region 1012a or the second region 1012b, depending on the proximity of the nanowells 1015 to each region. Additionally, in some examples, different regions of a given waveguide excite different nanowells 1015 in the nanostructure layer 1035. For example, if the waveguide is patterned as a slab waveguide, different slabs can excite (e.g., turn on) different nanowells 1015. A slab waveguide can be understood to describe a single waveguide with light confined in one axis only (e.g., a vertical axis through the sensor). Some examples include a series of waveguides that are formed on a given layer, instead of a single waveguide.

As discussed above, in some examples, forming optical coupling structures on a lower index layer (e.g., a waveguide integration layer) in regions that abut the active surface of the detector (e.g., the active surface of a CMOS sensor), and utilizing these structures to refract light into a predetermined direction to a waveguide, rather than utilizing a light source positioned above the top layer or forming the optical coupling structures on the surface of a CMOS sensor, allows for the formation of flow cells with additional elements that can improve the overall efficacy of the cells. Thus, in some examples, not only can illumination and detection functionality be combined into a layer of a flow cell (e.g., bottom layer 620, 720, 820, 920), but because examples are not confined by the structural limitations of the flow cells of FIGS. 1-2 or concerned with obscuring the active surface, examples comprise flow cells with elements that increase overall efficiency of the flow cells that are precluded by these other configurations.

Figure 11:
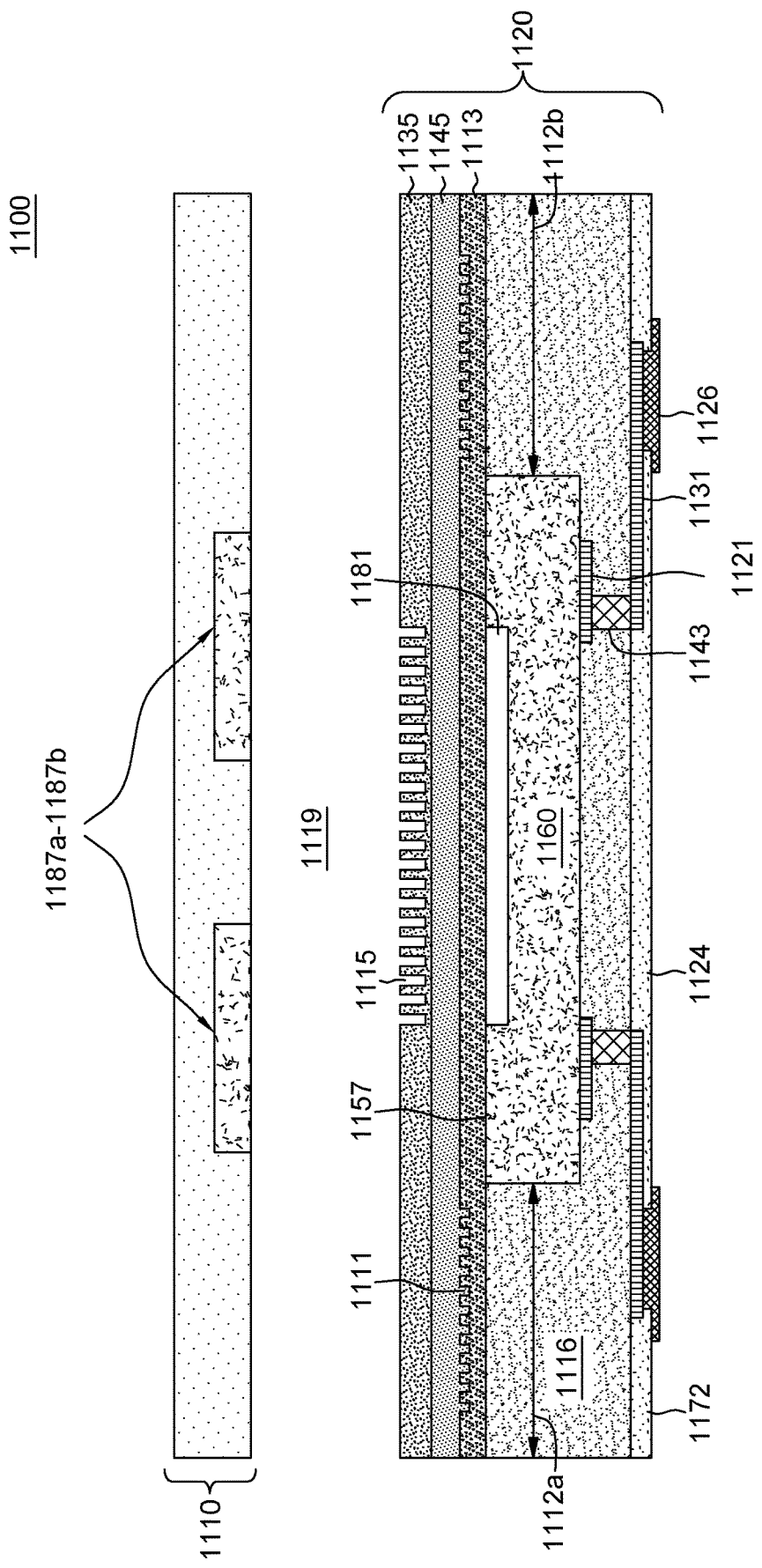
FIG. 11 illustrates various aspects of an example of a flow cell in accordance with some examples of the present implementation, which includes top layer that includes optically non-transparent features, which can help achieve help faster SBS kinetics.

FIG. 11 illustrates various aspects of a flow cell 1100, including a top layer 1110 and a bottom layer 1120. The bottom layer 1120 is similar in structure to the bottom layer 620 of FIG. 6 and/or the bottom layer 720 of FIG. 7. The top layer 1110 of the flow cell 1100 includes optically non-transparent features 1187a-1187b, which help achieve faster SBS kinetics. In some examples, optically non-transparent features 1187a-1187b comprise electrical components (e.g., electrodes) and in other examples, the optically non-transparent features 1187a-1187b comprise structures on the top layer 1110 of the flow cells (e.g., herringbone trenches). A flow channel 1119 is formed between the top layer 1110 and the bottom layer 1120.

Figure 12:
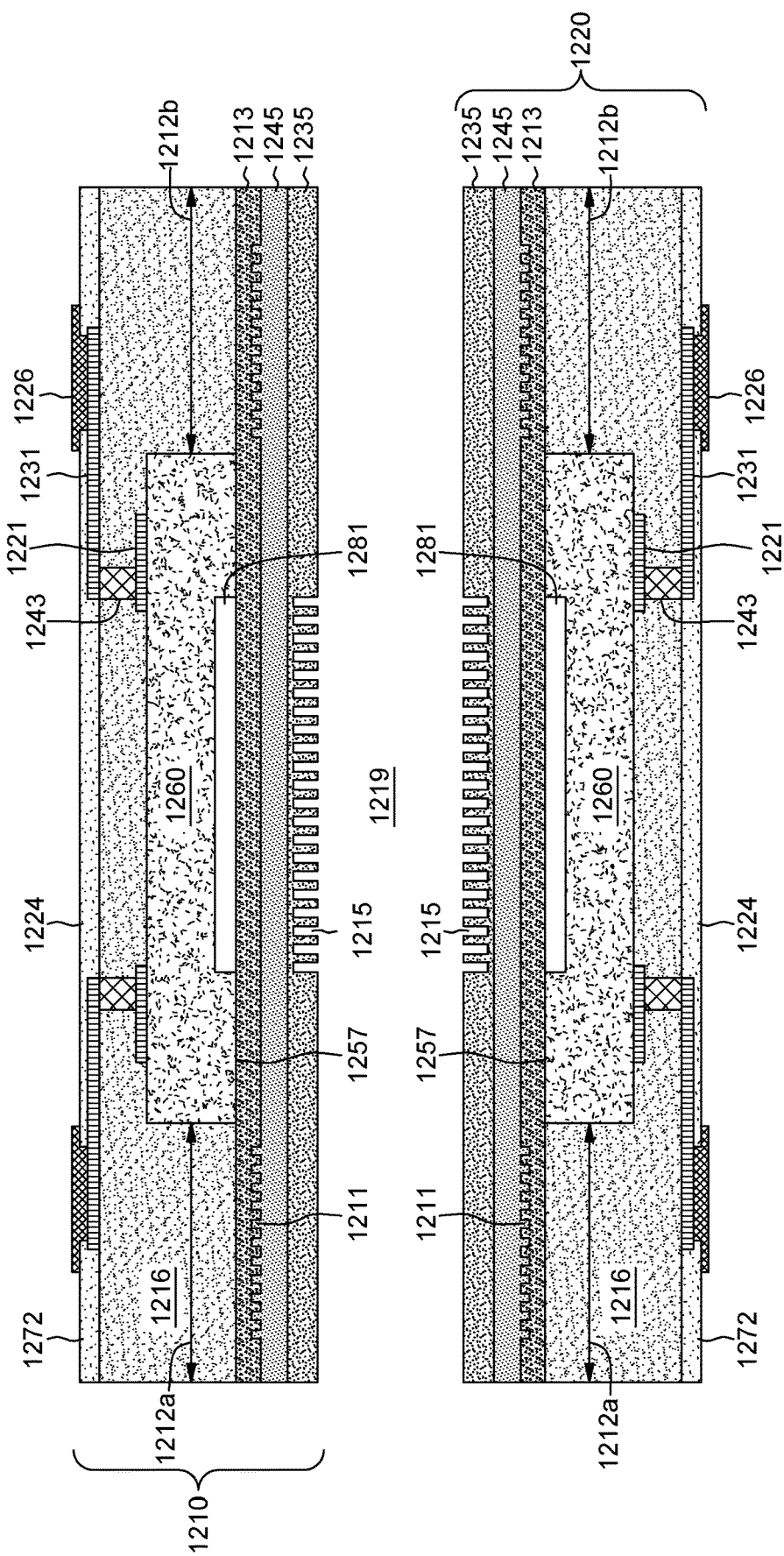
FIG. 12 illustrates various aspects of an example of a flow cell of the present implementation that includes a Complementary Metal-Oxide Semiconductor (CMOS) (light) detection device and two sequencing surfaces.

FIG. 12 illustrates a CMOS-based flow cell 1200 which, although it is a CMOS-based flow cell, includes two sequencing surfaces, one on the top layer 1210 and the second on the bottom layer 1220. The top layer 1210 and the bottom layer 1220 are both comprised of structures similar to the bottom layer 620 of FIG. 6 and/or the bottom layer 720 of FIG. 7. However, the top layer 1210 is flipped horizontally (along a horizontal axis). A flow channel 1219 is formed between the top layer 1210 and the bottom layer 1220. The sequencing surfaces of the top layer 1210 and the bottom layer 1220 can perform SBS simultaneously and/or in parallel.

Figure 13A:
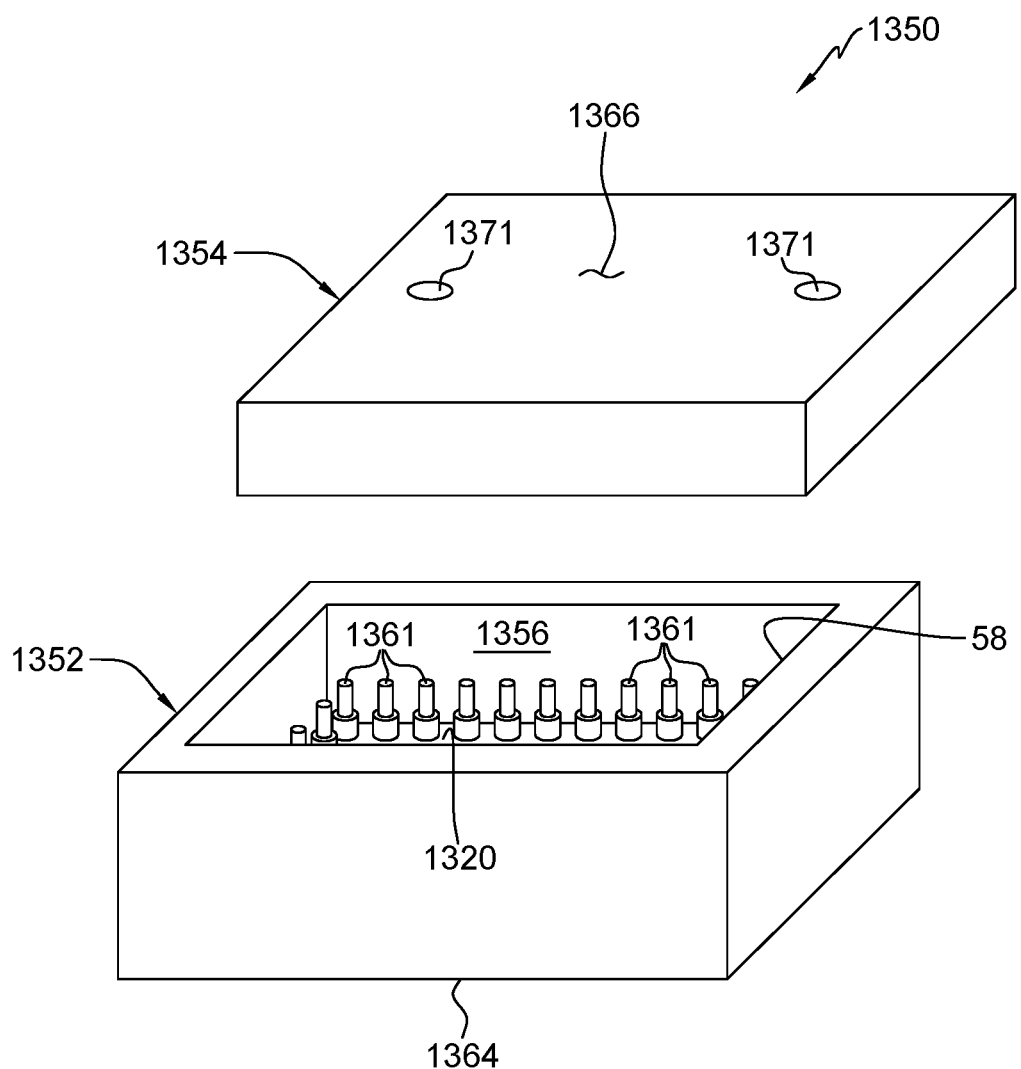
FIGS. 13A-13B depict an example of a socket that is formed into a flow cell, which can include a bottom layer in accordance with some examples of the present implementation.
Figure 13B:
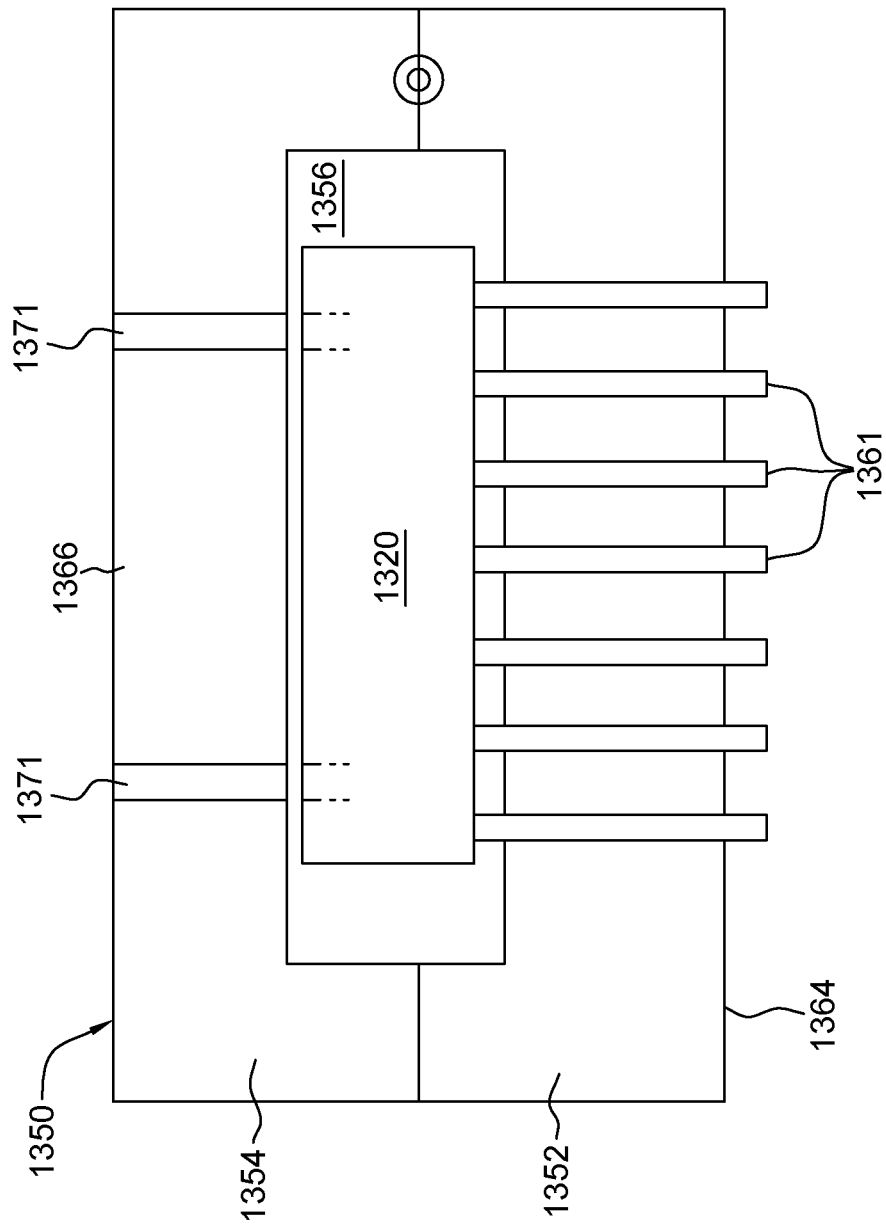

FIGS. 6-12 illustrate various partial or complete bottom layers of a flow cell, which can be integrated into a flow cell. FIGS. 13A-13B depicts an example of a socket 1350 that is formed into a flow cell, which can include a bottom layer of a flow cell disclosed herein, e.g., bottom layer 620 (FIG. 6), bottom layer 720 (FIG. 7), bottom layer 820 (FIG. 8G), or bottom layer 920 (FIG. 9). As illustrated in FIGS. FIG. 13A-13B, the flow cell is formed from a socket 1350 with a base portion 1352 that includes at least one port 1371. The socket 1350 includes an enclosure 1356, which is formed by the base portion 1356 and a cover portion 1354, cooperatively. Electrical contacts 1361 extend between the enclosure 1356 and an exterior side 1364 of the base portion 1356, in this non-limiting example, the exterior side 1364 is an exterior bottom surface. At least one port 137 extends between the enclosure and an exterior side of the cover portion 1366. A light emitting device which is referred to in many prior figures as the bottom layer 1320, and can includes the examples of FIGS. 6, 7, 8G, and 9 is secured within the socket 1350. For simplicity of understanding, the details of the bottom layer 1320 are not provided in FIGS. 13A-13B, but are illustrated in FIGS. 6, 7, 8G, and 9.

Figure 14:
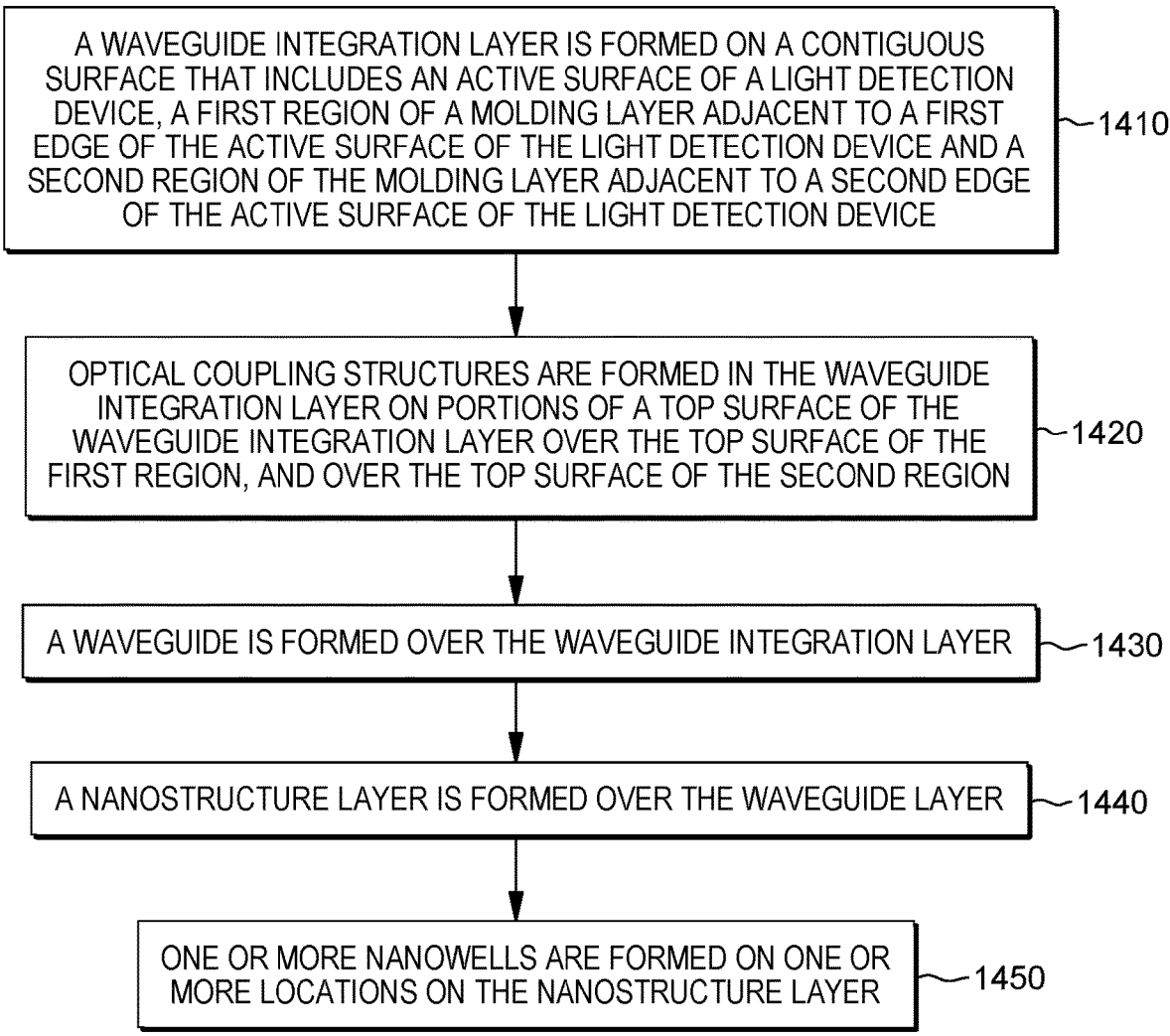
FIG. 14 depicts a workflow of a method of forming a bottom layer of a flow cell in accordance with certain aspects of some examples of the present implementation.

Examples in the present disclosure include one or more methods of forming a bottom layer of a flow cell. FIG. 14 depicts a workflow 1400 of a method of forming a bottom layer of a flow cell in accordance with certain aspects of some examples. Specifically, FIG. 14 depicts a workflow of forming a bottom layer of a flow cell, where the flow cell includes a top layer and the bottom layer with a channel between the top layer and the bottom layer. To form the bottom layer, a waveguide integration layer is formed on a contiguous surface that includes an active surface of a light detection device, a first region of a molding layer adjacent to a first edge of the active surface of the light detection device and a second region of the molding layer adjacent to a second edge of the active surface of the light detection device (1410). In some examples, the molding layer is over a substrate and covers sides of the light detection device and has a height relative to a top of the substrate. The molding height can be substantially equal to a height of the active surface of the light detection device relative to a top surface of the substrate.

Returning to FIG. 14, in some examples, optical coupling structures are formed in the waveguide integration layer on portions of a top surface of the waveguide integration layer over the top surface of the first region, and over the top surface of the second region (1420). Two non-limiting examples of processes that can be utilized to form the optical coupling structures are imprinting and/or lithography. In some examples, the lithography includes, but is not limited to, nanoimprint lithography and/or optical lithography. A waveguide is formed over the waveguide integration layer (1430). In some examples, the waveguide integration layer optically couples light waves from a light source to the waveguide layer and the waveguide layer utilizes the light waves from the waveguide integration layer to excite light sensitive materials in one or more nanowells. The bottom layer also includes a nanostructure layer. A nanostructure layer is formed over the waveguide layer (1440). The aforementioned one or more nanowells are formed on one or more locations on the nanostructure layer (1450). Two non-limiting examples of processes that can be utilized to form the nanowells are imprinting and/or lithography. In some examples, each location of the one or more locations shares a vertical axis with a location on the active surface of the light detection device.

The remainder of the flow cell can be formed by forming a top layer over the nanostructure layer. In some examples, top layer and the active surface collectively form a space over the nanostructure layer of the light detection device, the space defining a flow channel. Components can be integrated into this top layer, including but not limited to actives features and/or structures.

In some examples, the disclosed example is an apparatus that comprises a molding layer over a substrate and covering sides of a light detection device. The molding layer comprises a first region adjacent to a first edge of an active surface of the light detection device and a second region adjacent to a second edge of the active surface of the light detection device, where the first region, the second region, and the active surface of the light detection device form a contiguous surface. A waveguide integration layer is between the contiguous surface and a waveguide. The waveguide integration layer comprises optical coupling structures on portions of a top surface of the waveguide integration layer over the top surface of the first region, and over the top surface of the second region. The optical coupling structures couple light waves from a light source to the waveguide. The example includes the waveguide over the waveguide integration layer. The waveguide utilizes the light waves from the waveguide integration layer to excite light sensitive materials in one or more nanowells. The example includes a nanostructure layer over the waveguide. The nanostructure layer comprising the one or more nanowells. The one or more nanowells are formed on one or more locations on the nanostructure layer. Each location of the one or more locations shares a vertical axis with a location on the active surface of the light detection device.

In some examples of the apparatus, the first region and the second region do not overlap the active surface of the light detection device.

In some examples of the apparatus, the optical coupling structures comprise gratings.

In some examples of the apparatus, the waveguide integration layer is comprised of a material with a low index of refraction.

In some examples of the apparatus, the waveguide comprises a material with a high index of refraction.

In some examples of the apparatus, the nanostructure layer comprises a material with a low index of refraction.

In some examples of the apparatus, the apparatus also includes one or more low index layers between the waveguide and the nanostructure layer.

In some examples of the apparatus, the apparatus also includes a filter layer over the contiguous surface and under the waveguide integration layer, wherein the filter layer blocks light from the waveguide from leaking to the light detection device.

In some examples of the apparatus, the light source is selected from the group consisting of: a light emitting diode and a laser diode.

In some examples of the apparatus, the light detection device comprises one or more photodiodes, wherein each of the one or more photodiodes is located beneath one or more nanowells.

In some examples of the apparatus, the light detection device comprises a Complementary Metal-Oxide-Semiconductor (CMOS) detection device.

In some examples of the apparatus, the apparatus also includes a top layer over the contiguous surface, wherein the top layer and the active surface collectively form a space over the nanostructure layer, the space defining a flow channel.

In some examples of the apparatus, the top layer further comprising a feature selected from the group consisting of an electrical component and a physical structure.

In some examples of the apparatus, the top layer comprises an electrode.

In some examples of the apparatus, the top layer comprises a herringbone trench.

In some examples of the apparatus, the waveguide comprises one or more slab waveguides.

In some examples of the apparatus, the top layer comprises a second molding layer below a second substrate and covering sides of a second light detection device, wherein the second molding layer comprises a first region adjacent to a first edge of an active surface of the second light detection device and a second region adjacent to a second edge of the active surface of the second light detection device. The first region of the second molding layer, the second region of the second molding layer, and the active surface of the second light detection device form a second contiguous surface. The top layer also includes a second waveguide integration layer between the second contiguous surface and a second waveguide, wherein the second waveguide integration layer comprises optical coupling structures on portions of a top surface of the second waveguide integration layer below the top surface of the first region of the second molding layer, and below the top surface of the second region of the second molding layer, wherein the optical coupling structures on the portions of the top surface of the second waveguide integration layer couple light waves from the light source to the second waveguide. The top layer also includes the second waveguide below the waveguide integration layer. The second waveguide utilizes the light waves from the second waveguide integration layer to excite light sensitive materials in one or more additional nanowells. The top layer also includes a second nanostructure layer below the second waveguide, the second nanostructure layer comprising the one or more additional nanowells. The one or more additional nanowells are formed on one or more locations on the second nanostructure layer. Each location of the one or more locations on the second nanostructure layer shares a vertical axis with a location on the active surface of the second light detection device.

In some examples of the apparatus, a vertical height of the second molding relative to a bottom surface of the second substrate is at least substantially equal to a height of an active surface of the second light detection device relative to the bottom surface of the second substrate.

In some examples of the apparatus, a period of the light waves passed to the waveguide from the optical coupling structures of the waveguide integration layer, is selected from the group consisting of: variable and fixed.

In some examples of the apparatus, by at least optically coupling light waves from the light source to one or more nanowells, a specific portion of the waveguide excites a specific number of nanowells of the one or more nanowells.

In some examples of the apparatus, the apparatus is part of a flow cell.

In some examples of the apparatus, the apparatus is secured within an enclosure of a socket, the socket comprising a base portion, a plurality of electrical contacts, and a cover portion coupled with the base portion comprising at least one first port. The base portion and the cover portion cooperatively form the enclosure. The electrical contacts extend between the enclosure and an exterior side of the base portion, and the at least one first port extends between the enclosure and an exterior side of the cover portion. The light detection device is electrically coupled to the electrical contacts of the socket.

In some examples of the apparatus, a vertical height of the molding relative to a top surface of the substrate is at least substantially equal to a height of an active surface of the light detection device relative to the top surface of the substrate.

In some examples of the apparatus, a portion of the optical coupling structures over portions of a top surface of the waveguide integration layer over the top surface of the first region comprises a first grating, and a portion of the optical coupling structures over portions of a top surface of the waveguide integration layer over the top surface of the second region comprises a second grating. A first portion of the nanowells are optically coupled to the first grating, and a second portion of the nanowells are optically coupled to the second grating.

In some examples of the apparatus, the first portion of the nanowells comprises a portion of the nanowells within a pre-defined proximity of the first grating and the second portion of the nanowells comprises a portion of the nanowells within the pre-defined proximity of the second grating.

In some examples of the apparatus, the first portion of the nanowells and the second portion of the nanowells comprise all the nanowells and each nanowell is in either the first portion or the second portion.

In some examples, a flow cell is disclosed that comprises a socket comprising a base portion, a plurality of electrical contacts, and a cover portion coupled with the base portion comprising at least one first port. The base portion and the cover portion cooperatively form an enclosure. The electrical contacts extend between the enclosure and an exterior side of the base portion, and the at least one first port extends between the enclosure and an exterior side of the cover portion. The flow cell also includes a light emitting device secured within the enclosure of the socket and the light emitting device comprises a molding layer over a substrate and covering sides of a light detection device. The molding layer comprises a first region adjacent to a first edge of an active surface of the light detection device and a second region adjacent to a second edge of the active surface of the light detection device, wherein the first region, the second region, and the active surface of the light detection device form a contiguous surface. The light emitting device also includes a waveguide integration layer between the contiguous surface and a waveguide. The waveguide integration layer comprises optical coupling structures on portions of a top surface of the waveguide integration layer over the top surface of the first region, and over the top surface of the second region. The optical coupling structures couple light waves from a light source to the waveguide. The light emitting device includes the waveguide over the waveguide integration layer. The waveguide utilizes the light waves from the waveguide integration layer to excite light sensitive materials in one or more nanowells. The light emitting device includes a nanostructure layer over the waveguide, the nanostructure layer comprising the one or more nanowells. The one or more nanowells are formed on one or more locations on the nanostructure layer. Each location of the one or more locations shares a vertical axis with a location on the active surface of the light detection device. The light detection device is electrically coupled to the electrical contacts of the socket.

In some examples, a method is disclosed that includes forming a bottom layer of a flow cell. The flow cell comprises a top layer and the bottom layer with a channel between the top layer and the bottom layer. The forming comprises forming a waveguide integration layer on a contiguous surface comprised of an active surface of a light detection device, a first region of a molding layer adjacent to a first edge of the active surface of the light detection device and a second region of the molding layer adjacent to a second edge of the active surface of the light detection device. The molding layer is over a substrate and covers sides of the light detection device, the molding layer can have a molding height relative to a top of the substrate, the molding height being at least substantially equal to a height of an active surface of the light detection device relative to a top surface of the substrate. The method also includes forming optical coupling structures in the waveguide integration layer on portions of a top surface of the waveguide integration layer over the top surface of the first region, and over the top surface of the second region. The method also includes forming a waveguide layer over the waveguide integration layer. The waveguide integration layer optically couples light waves from a light source to the waveguide layer, and wherein the waveguide layer utilizes the light waves from the waveguide integration layer to excite light sensitive materials in one or more nanowells. The method includes forming a nanostructure layer over the waveguide layer. The method also includes forming the one or more nanowells on one or more locations on the nanostructure layer. Each location of the one or more locations shares a vertical axis with a location on the active surface of the light detection device.

In some examples of the method, forming the optical coupling structures comprises utilizing a process to generate the optical coupling structures selected from the group consisting of: imprinting, nanoimprint lithography and optical lithography In some examples of the method, forming the one or more nanowells comprises utilizing a process selected from the group consisting of: imprinting, nanoimprint lithography and optical lithography In some examples of the method, the method further comprises forming a top layer over the nanostructure layer. The top layer and the active surface collectively form a space over the nanostructure layer of the light detection device, the space defining a flow channel.

In some examples of the method, the method further comprises integrating a feature into the top layer, the feature selected from the group consisting of: an electrical component and a physical structure.

The flowchart and block diagrams in the Figures illustrate the architecture, functionality, and operation of possible examples of systems, methods, and computer program products according to various examples in the disclosure. In this regard, each block in the flowchart or block diagrams can represent a module, segment, or portion of instructions, which comprises one or more executable instructions for implementing the specified logical function(s). In some alternative examples, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular examples only and is not intended to be limiting. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components and/or groups thereof.

The corresponding structures, materials, acts, and equivalents of all means or step plus function elements in the claims below, if any, are intended to include any structure, material, or act for performing the function in combination with other claimed elements as specifically claimed. The description of one or more examples has been presented for purposes of illustration and description, but is not intended to be exhaustive or limited to in the form disclosed. Many modifications and variations will be apparent to those of ordinary skill in the art. The example was chosen and described in order to best explain various aspects and the practical application, and to enable others of ordinary skill in the art to understand various examples with various modifications as are suited to the particular use contemplated.

It should be appreciated that all combinations of the foregoing concepts and additional concepts discussed in greater detail below (provided such concepts are not mutually inconsistent) are contemplated as being part of the subject matter disclosed herein at least to achieve the benefits as described herein. In particular, all combinations of claims subject matter appearing at the end of this disclosure are contemplated as being part of the subject matter disclosed herein. It should also be appreciated that terminology explicitly employed herein that also may appear in any disclosure incorporated by reference should be accorded a meaning most consistent with the particular concepts disclosed herein.

This written description uses examples to disclose the subject matter, and also to enable any person skilled in the art to practice the subject matter, including making and using any devices or systems and performing any incorporated methods. The patentable scope of the subject matter is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

It is to be understood that the above description is intended to be illustrative, and not restrictive. For example, the above-described examples (and/or aspects thereof) may be used in combination with each other. In addition, many modifications may be made to adapt a particular situation or material to the teachings of the various examples without departing from their scope. While the dimensions and types of materials described herein are intended to define the parameters of the various examples, they are by no means limiting and are merely provided by way of example. Many other examples will be apparent to those of skill in the art upon reviewing the above description. The scope of the various examples should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Forms of term "based on" herein encompass relationships where an element is partially based on as well as relationships where an element is entirely based on. Forms of the term "defined" encompass relationships where an element is partially defined as well as relationships where an element is entirely defined. Further, the limitations of the following claims are not written in means-plus-function format and are not intended to be interpreted based on 35 U.S.C. § 112, sixth paragraph, unless and until such claim limitations expressly use the phrase "means for" followed by a statement of function void of further structure. It is to be understood that not necessarily all such objects or advantages described above may be achieved in accordance with any particular example. Thus, for example, those skilled in the art will recognize that the systems and techniques described herein may be embodied or carried out in a manner that achieves or optimizes one advantage or group of advantages as taught herein without necessarily achieving other objects or advantages as may be taught or suggested herein.

While the subject matter has been described in detail in connection with only a limited number of examples, it should be readily understood that the subject matter is not limited to such disclosed examples. Rather, the subject matter can be modified to incorporate any number of variations, alterations, substitutions or equivalent arrangements not heretofore described, but which are commensurate with the spirit and scope of the subject matter. Additionally, while various examples of the subject matter have been described, it is to be understood that aspects of the disclosure may include only some of the described examples. Also, while some examples are described as having a certain number of elements it will be understood that the subject matter can be practiced with less than or greater than the certain number of elements. Accordingly, the subject matter is not to be seen as limited by the foregoing description, but is only limited by the scope of the appended claims.

What is claimed is:

1. An apparatus comprising:
a molding layer over a substrate and covering sides of a light detection device, wherein the molding layer comprises a first region adjacent to a first edge of an active surface of the light detection device and a second region adjacent to a second edge of the active surface of the light detection device, wherein the first region, the second region, and the active surface of the light detection device form a contiguous surface;
a waveguide integration layer between the contiguous surface and a waveguide, wherein the waveguide integration layer comprises optical coupling structures on portions of a top surface of the waveguide integration layer over the top surface of the first region, and over the top surface of the second region, wherein the optical coupling structures couple light waves from a light source to the waveguide;
the waveguide over the waveguide integration layer, wherein the waveguide utilizes the light waves from the waveguide integration layer to excite light sensitive materials in one or more nanowells; a nanostructure layer over the waveguide, the nanostructure layer comprising the one or more nanowells, wherein the one or more nanowells are formed on one or more locations on the nanostructure layer, wherein each location of the one or more locations shares a vertical axis with a location on the active surface of the light detection device; and
a top layer over the contiguous surface, wherein the top layer and the active surface collectively form a space over the nanostructure layer, the space defining a flow channel, wherein the top layer comprises:
a second molding layer below a second substrate and covering sides of a second light detection device, wherein the second molding layer comprises a first region adjacent to a first edge of an active surface of the second light detection device and a second region adjacent to a second edge of the active surface of the second light detection device, wherein the first region of the second molding layer, the second region of the second molding layer, and the active surface of the second light detection device form a second contiguous surface;
a second waveguide integration layer between the second contiguous surface and a second waveguide, wherein the second waveguide integration layer comprises optical coupling structures on portions of a top surface of the second waveguide integration layer below the top surface of the first region of the second molding layer, and below the top surface of the second region of the second molding layer, wherein the optical coupling structures on the portions of the top surface of the second waveguide integration layer couple light waves from the light source to the second waveguide;
the second waveguide below the waveguide integration layer, wherein the second waveguide utilizes the light waves from the second waveguide integration layer to excite light sensitive materials in one or more additional nanowells; and
a second nanostructure layer below the second waveguide, the second nanostructure layer comprising the one or more additional nanowells, wherein the one or more additional nanowells are formed on one or more locations on the second nanostructure layer, wherein each location of the one or more locations on the second nanostructure layer shares a vertical axis with a location on the active surface of the second light detection device.

2. The apparatus of claim 1, wherein the first region and the second region do not overlap the active surface of the light detection device.

3. The apparatus of claim 1, wherein the optical coupling structures comprise gratings comprising a first grating and a second grating.

4. The apparatus of claim 3, wherein a portion of the optical coupling structures over portions of a top surface of the waveguide integration layer over the top surface of the first region comprises the first grating, and a portion of the optical coupling structures over portions of a top surface of the waveguide integration layer over the top surface of the second region comprises the second grating, wherein a first portion of the nanowells are optically coupled to the first grating, wherein a second portion of the nanowells are optically coupled to the second grating, and wherein the first portion of the nanowells comprises a portion of the nanowells within a pre-defined proximity of the first grating and the second portion of the nanowells comprises a portion of the nanowells within the pre-defined proximity of the second grating.

5. The apparatus of claim 4, wherein the first portion of the nanowells and the second portion of the nanowells comprise all the nanowells and each nanowell is in either the first portion or the second portion.

6. The apparatus of claim 1, wherein the waveguide integration layer is comprised of a material selected from the group consisting of: a material with a low index of refraction and a material with a high index of refraction.

7. The apparatus of claim 1, wherein the nanostructure layer comprises a material with a low index of refraction, the apparatus further comprising:
one or more low index layers between the waveguide and the nanostructure layer.

8. The apparatus of claim 1, further comprising:
a filter layer over the contiguous surface and under the waveguide integration layer, wherein the filter layer blocks light from the waveguide from leaking to the light detection device.

9. The apparatus of claim 1, wherein the light detection device comprises a Complementary Metal-Oxide-Semiconductor (CMOS) detection device, and wherein the apparatus is part of a flow cell.

10. The apparatus of claim 1, the top layer further comprising a feature selected from the group consisting of an electrical component and a physical structure.

11. The apparatus of claim 1, wherein a vertical height of the second molding relative to a bottom surface of the second substrate being at least substantially equal to a height of an active surface of the second light detection device relative to the bottom surface of the second substrate.

12. The apparatus of claim 1, wherein a vertical height of the molding relative to a top surface of the substrate is at least substantially equal to a height of an active surface of the light detection device relative to the top surface of the substrate.

13. The apparatus of claim 1, wherein a period of the light waves passed to the waveguide from the optical coupling structures of the waveguide integration layer, is selected from the group consisting of: variable and fixed, and wherein by at least optically coupling light waves from the light source to one or more nanowells, a specific portion of the waveguide excites a specific number of nanowells of the one or more nanowells.

14. The apparatus of claim 1, wherein the apparatus is secured within an enclosure of a socket, the socket comprising a base portion, a plurality of electrical contacts, and a cover portion coupled with the base portion comprising at least one first port, wherein the base portion and the cover portion cooperatively form the enclosure, wherein the electrical contacts extend between the enclosure and an exterior side of the base portion, and the at least one first port extends between the enclosure and an exterior side of the cover portion, wherein the light detection device is electrically coupled to the electrical contacts of the socket.

15. A flow cell, comprising:
a socket comprising a base portion, a plurality of electrical contacts, and a cover portion coupled with the base portion comprising at least one first port, wherein the base portion and the cover portion cooperatively form an enclosure, wherein the electrical contacts extend between the enclosure and an exterior side of the base portion, and the at least one first port extends between the enclosure and an exterior side of the cover portion; and
a light emitting device secured within the enclosure of the socket, comprising:
a molding layer over a substrate and covering sides of a light detection device, wherein the molding layer comprises a first region adjacent to a first edge of an active surface of the light detection device and a second region adjacent to a second edge of the active surface of the light detection device, wherein the first region, the second region, and the active surface of the light detection device form a contiguous surface;
a waveguide integration layer between the contiguous surface and a waveguide, wherein the waveguide integration layer comprises optical coupling structures on portions of a top surface of the waveguide integration layer over the top surface of the first region, and over the top surface of the second region, wherein the optical coupling structures couple light waves from a light source to the waveguide;
the waveguide over the waveguide integration layer, wherein the waveguide utilizes the light waves from the waveguide integration layer to excite light sensitive materials in one or more nanowells;
a nanostructure layer over the waveguide, the nanostructure layer comprising the one or more nanowells, wherein the one or more nanowells are formed on one or more locations on the nanostructure layer, wherein each location of the one or more locations shares a vertical axis with a location on the active surface of the light detection device; and
a top layer over the contiguous surface, wherein the top layer and the active surface collectively form a space over the nanostructure layer, the space defining a flow channel, wherein the top layer comprises:
a second molding layer below a second substrate and covering sides of a second light detection device, wherein the second molding layer comprises a first region adjacent to a first edge of an active surface of the second light detection device and a second region adjacent to a second edge of the active surface of the second light detection device, wherein the first region of the second molding layer, the second region of the second molding layer, and the active surface of the second light detection device form a second contiguous surface;
a second waveguide integration layer between the second contiguous surface and a second waveguide, wherein the second waveguide integration layer comprises optical coupling structures on portions of a top surface of the second waveguide integration layer below the top surface of the first region of the second molding layer, and below the top surface of the second region of the second molding layer, wherein the optical coupling structures on the portions of the top surface of the second waveguide integration layer couple light waves from the light source to the second waveguide;
the second waveguide below the waveguide integration layer, wherein the second waveguide utilizes the light waves from the second waveguide integration layer to excite light sensitive materials in one or more additional nanowells; and
a second nanostructure layer below the second waveguide, the second nanostructure layer comprising the one or more additional nanowells, wherein the one or more additional nanowells are formed on one or more locations on the second nanostructure layer, wherein each location of the one or more locations on the second nanostructure layer shares a vertical axis with a location on the active surface of the second light detection device,
wherein the light detection device is electrically coupled to the electrical contacts of the socket.

* * * * *